US011264388B2

(12) United States Patent
Wang

(10) Patent No.: US 11,264,388 B2
(45) Date of Patent: Mar. 1, 2022

(54) MICROELECTRONIC DEVICES INCLUDING DECOUPLING CAPACITORS, AND RELATED APPARATUSES, ELECTRONIC SYSTEMS, AND METHODS

(71) Applicant: Micron Technology, Inc., Boise, ID (US)

(72) Inventor: Chao Wen Wang, Central CTSP (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/876,362

(22) Filed: May 18, 2020

(65) Prior Publication Data

US 2021/0358915 A1    Nov. 18, 2021

(51) Int. Cl.
| | | |
|---|---|---|
| *H01L 27/108* | (2006.01) | |
| *H01L 23/528* | (2006.01) | |
| *G11C 5/10* | (2006.01) | |
| *H01L 49/02* | (2006.01) | |
| *G11C 5/02* | (2006.01) | |
| *H01L 23/522* | (2006.01) | |

(52) U.S. Cl.
CPC ........ *H01L 27/10805* (2013.01); *G11C 5/025* (2013.01); *G11C 5/10* (2013.01); *H01L 23/528* (2013.01); *H01L 23/5226* (2013.01); *H01L 28/60* (2013.01)

(58) Field of Classification Search
CPC .......... H01L 27/10805; H01L 23/5226; H01L 23/528; H01L 28/60; G11C 5/025; G11C 5/10

USPC ......................................................... 257/532
See application file for complete search history.

(56) References Cited

U.S. PATENT DOCUMENTS

| | | | |
|---|---|---|---|
| 6,740,922 B2 * | 5/2004 | Jones .................. | H01L 27/0805 257/303 |
| 2007/0278619 A1 * | 12/2007 | Clevenger ......... | H01L 21/76898 257/532 |
| 2019/0304955 A1 | 10/2019 | Sasaki et al. | |

OTHER PUBLICATIONS

Ahmad et al., Decoupling Capacitance for the Power Integrity of 3D-DRAM-Over-Logic System, 2011 13th Electronics Packaging Technology Conference, (2011), pp. 590-594.

* cited by examiner

*Primary Examiner* — Tu-Tu V Ho
(74) *Attorney, Agent, or Firm* — TraskBritt

(57) ABSTRACT

A microelectronic device comprises a die comprising a front side and a back side opposite the front side, one or more components of integrated circuitry within a base material of the die and between the front side and the back side of the die, and one or more decoupling capacitors within the back side of the die. The one or more decoupling capacitors comprise a first electrode, a second electrode, and a dielectric material between the first electrode and the second electrode. The microelectronic device further comprises a first conductive via comprising a conductive material extending through the base material, the first conductive via in electrical communication with the first electrode of the one or more decoupling capacitors and the front side of the microelectronic device. Related apparatuses including a decoupling capacitor in a back side, and related electronic systems and methods are also described.

23 Claims, 21 Drawing Sheets

MICROELECTRONIC DEVICES INCLUDING DECOUPLING CAPACITORS, AND RELATED APPARATUSES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices and apparatuses including one or more decoupling capacitors in a back side thereof, and to related electronic systems and methods of forming the microelectronic devices and apparatuses.

BACKGROUND

Microelectronic device designers often desire to increase the level of integration or density of features (e.g., components) within a microelectronic device (e.g., a semiconductor device) by reducing the dimensions of the individual features and by reducing the separation distance between neighboring features. In addition, microelectronic device designers often desire to design architectures that are not only compact, but offer performance advantages, as well as simplified designs. Reducing the dimensions and spacing of microelectronic device features places ever increasing demands on the methods used to form the microelectronic device features.

A relatively common microelectronic device is a memory device, which may include a memory array having a number of memory cells arranged in a grid pattern on an active surface of the device. One type of memory cell is a dynamic random access memory (DRAM) device, which is a volatile memory device that may lose a stored state over time unless the DRAM device is periodically refreshed by an external power supply. In the simplest design configuration, a DRAM cell includes one access device (e.g., a transistor) and one storage device (e.g., a capacitor). Modern applications for memory devices may utilize vast numbers of DRAM unit cells, arranged in an array of rows and columns. The DRAM cells are electrically accessible through digit lines and word lines arranged along the rows and columns of the array. High data reliability, high speed of memory access, reduced chip size, and reduced power consumption are desirable performance properties of DRAM devices. In the DRAM device, power supply lines provide power from an external power source to components (e.g., transistors, capacitors, etc.) of the DRAM device. The power supply lines are usually arranged throughout the DRAM device as metal layers.

Microelectronic devices may include decoupling capacitors that are configured to store local charge during switching of the logic load of the microelectronic device in order to control the voltage variation and ensure the power integrity of the microelectronic device. However, decoupling capacitors in microelectronic devices may consume a large amount of the useful active surface area on the microelectronic device die, which useful area could otherwise be used to improve the feature density (e.g., memory density) of the microelectronic device.

DETAILED DESCRIPTION

Figure 1A:
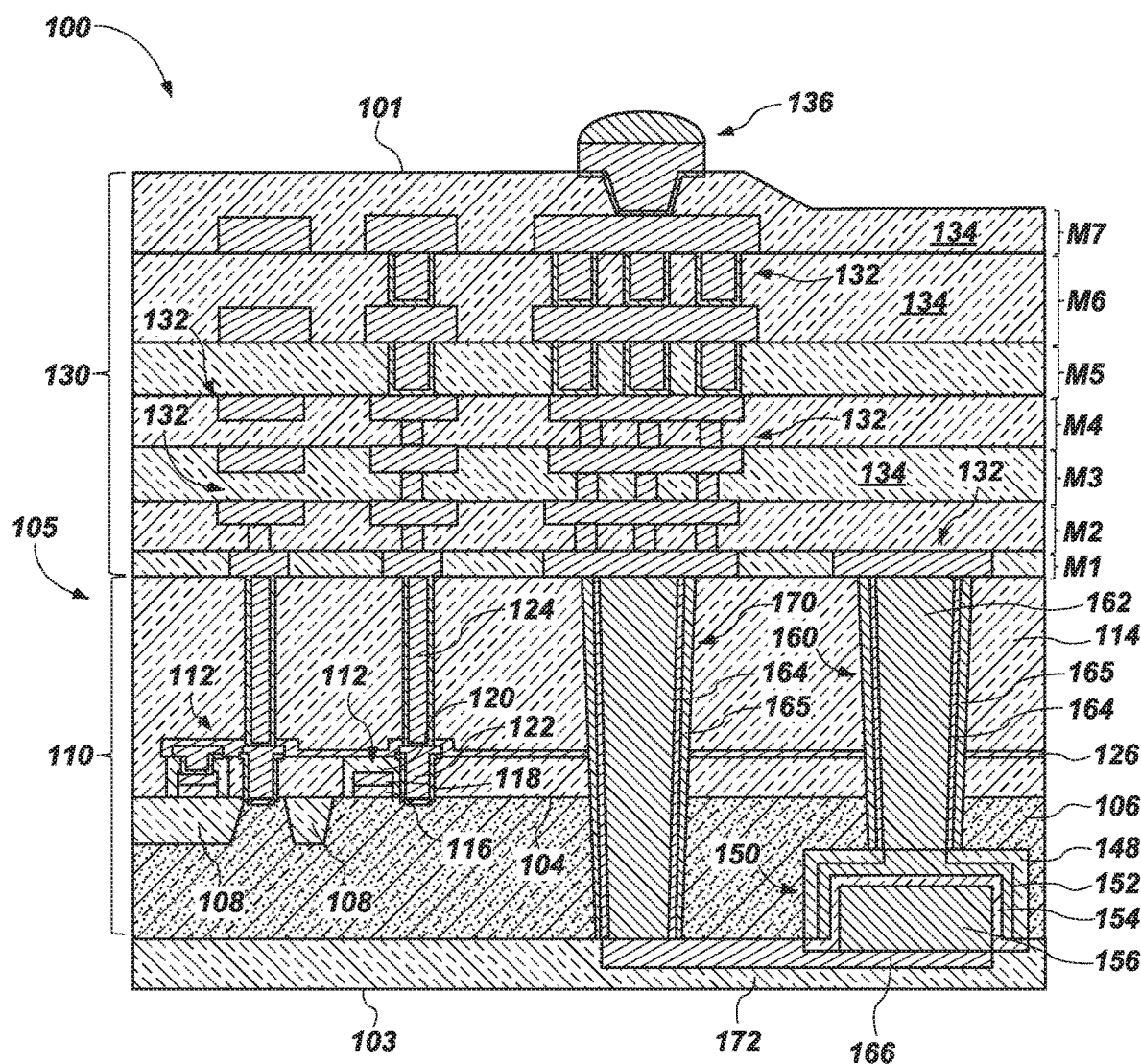
FIG. 1A is a simplified cross-sectional view of a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, or electronic system, or a complete microelectronic device, apparatus, or electronic system including one or more decoupling capacitors on a back side thereof. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "memory device" means and includes microelectronic devices exhibiting memory functionality, but not necessary limited to memory functionality. Stated another way, and by way of example only, the term "memory device" means and includes not only conventional memory in the form of DRAM, NAND, etc., but also by way of example only, an application specific integrated circuit (ASIC) (e.g., a system on a chip (SoC)), a microelectronic device combining logic and memory, or a graphics processing unit (GPU) incorporating memory.

As used herein, the term "decoupling capacitor" means and includes a capacitor configured to decouple one part of a circuit (electrical network) from another. For example, noise caused by other circuit elements (such as a power supply, an output, one or more memory devices, a memory array, or other component) may be passed through (e.g., shunted through) the decoupling capacitor, reducing the effect of (e.g., noise caused by) the other circuit elements on the circuit. A decoupling capacitor may be configured to store a charge during switching of a logic load of an associated logic device (e.g., memory device) to control the voltage variation and provide a constant power to the microelectronic device. As a non-limiting example, a decoupling capacitor may be configured to suppress voltage surges that might otherwise damage other parts of a circuit. The terms "bypass capacitor" and "buffer capacitor" may be used interchangeably with "decoupling capacitor."

According to embodiments described herein, a microelectronic device comprises a die including a front side (i.e., active surface) and a back side opposite the front side. The die may include active circuitry between the front side and the back side. For example, the die may include front end of the line (FEOL) structures, such as various components of active circuitry. The FEOL structures may include one or more of capacitors, transistors, electrodes, diodes, memory cells, resistors, metal structures, conductive lines (e.g., access lines, digit lines, word lines), and other components. In some embodiments, some components of the active circuitry are formed within or adjacent to a semiconductive material while other components of the active circuitry are formed within or adjacent to an insulative material. The front side of the die may further include, over and adjacent to the FEOL structures, back end of the line (BEOL) structures. The BEOL structures may include various metal lines and redistribution lines for transferring one or more electrical paths from the FEOL structure to the front side of the die.

The back side of the die may include one or more decoupling capacitors therein. The decoupling capacitors may include a first electrode, a second electrode, and a dielectric material between the first electrode and the second electrode. The first electrode may be electrically coupled to a first conductive via (e.g., a through silicon via (TSV), a through substrate via) extending through at least a portion of the die. The first conductive via may be electrically coupled to the front side. The second electrode may be electrically coupled to a second conductive via extending through at least a portion of the die. The second conductive via may be in electrical communication with the front side of the die. Accordingly, the decoupling capacitor may be located within or proximate the back side of the die, and may be electrically coupled to terminals on the front side of the die. In some embodiments, at least one of the first conductive via and the second conductive via is laterally offset from the respective one of the first electrode and the second electrode by means of a redistribution line. Forming the decoupling capacitor in the back side of the die may facilitate provision of decoupling capacitors to the microelectronic device without substantially reducing the area on the active surface of the die available for various features (e.g., memory devices) of the die. In addition, since the decoupling capacitors are formed on the back side of the die (rather than on the front side, such as within or proximate to the active circuitry region), the decoupling capacitors may be formed with less expensive processing conditions without strict tolerances of structures formed in the front side of the die. Since the fabrication of the decoupling capacitors is separate from (e.g., decoupled from) front side processing, the fabrication of the decoupling capacitors may not directly impact fabrication of the active circuitry and the entire back side of the die may be available for the decoupling capacitors. Further, forming the decoupling capacitors in the back side of the die may not increase the thickness of the front side of the die, which would reduce the available thickness of the semiconductive material (e.g., silicon) of the die and reduce the impedance and strength of the die due to the corresponding decrease in the bulk semiconductive material. Further, forming the decoupling capacitors in the back side of the die may allow for maintaining the die at minimal thickness suitable for mobile applications which require reduced height in the form factor parameters.

FIG. 1A is a simplified cross-sectional view of a microelectronic device 100, in accordance with embodiments of the disclosure. The microelectronic device 100 may include a volatile or non-volatile memory device (e.g., semiconductor memory device). For example, the microelectronic device 100 may comprise dynamic random access memory (DRAM), magnetic random access memory (MRAM), static random access memory (SRAM), NAND Flash memory, 3D memory (e.g., 3D DRAM, 3D SRAM) including stacked memory dice in the form of, for example, high bandwidth memory (HBM) configurations of DRAM, or another known memory type. However, the disclosure is not so limited and the microelectronic device 100 may comprise other forms of memory devices.

The microelectronic device 100 may comprise a die 105 including a front side 101 and a back side 103 opposite the front side 101. In some embodiments, the microelectronic device 100 may also be referred to herein as a die. As will be described herein, during fabrication of the microelectronic device 100 various components thereof may be fabricated on the front side 101 and other components and structures may be fabricated on the back side 103.

The microelectronic device 100 includes a front end of the line (FEOL) structure 110, including a base material 106. The FEOL structure 110 may include, for example, active circuitry, such as one or more of capacitors, transistors, electrodes, diodes, memory cells, resistors, metal structures, conductive lines (access lines, digit lines, word lines), and other structures. In some embodiments, the FEOL structure 110 comprise a memory array region.

The base material 106 may include an active surface 104. The base material 106 may comprise, for example, a semiconductive material comprising one or more of a semiconductor substrate, a base semiconductor material on a supporting structure, or a semiconductor substrate having one or more layers, structures or regions formed thereon. The base material 106 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 106 may be doped or undoped or may include one or more doped regions and one or more undoped regions.

In some embodiments, the base material 106 may include electrically insulative structures 108, such as shallow trench isolation (STI) structures therein. The electrically insulative structures 108 may be formed of and include, for example, silicon dioxide, silicon nitride, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative structures 108 comprise silicon dioxide.

With reference to FIG. 1A, the FEOL structure 110 may include transistors 112 overlying the base material 106 and located within a dielectric material 114. The transistors 112 may include, for example, a gate dielectric material 116 adjacent to the base material 106 and spanning between a source region (not shown) and a drain region (not shown) of the base material 106, and a gate electrode 118 adjacent to the gate dielectric material 116. An insulative cap or sidewall spacers 120 may be located adjacent to the gate dielectric material 116 and the gate electrode 118. Although FIG. 1A illustrates the transistors 112 over the base material 106, in some embodiments, the FEOL structure 110 may include transistors 112 recessed into the base material 106. In some such embodiments, the transistors 112 may be buried and isolated from the base material 106 by, for example, the gate dielectric material 116.

Conductive contacts (e.g., conductive plugs) 122 may form electrical connections between conductive pillars 124 and the base material 106. The conductive contacts 122 may be formed of and include a conductive material (e.g., an electrically conductive material), such as one or more of metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive contacts 122 are formed of and include tungsten.

The conductive pillars 124 may be formed of and include a conductive material, such as one or more of the materials described above with reference to the conductive contacts 122. In some embodiments, the conductive pillars 124 comprise tungsten. In other embodiments, the conductive pillars 124 comprise copper.

In some embodiments, the conductive pillars 124 may form electrical contacts to capacitors (that may be located in a cross-section other than the one illustrated in FIG. 1A) that are operably coupled to the transistors 112 and configured and formulated to store a charge representative of a logic state of memory cells, as in DRAM devices.

The FEOL structure 110 may further include conductive traces 126 configured to reroute (e.g., redistribute) signals from various electrically conductive materials.

With continued reference to FIG. 1A, a back end of the line (BEOL) structure 130 may be located adjacent to and over the FEOL structure 110 proximate the front side 101 of the die 105. The BEOL structure 130 may include quantities of dielectric and electrically conductive materials selectively positioned and configured to form routing elements (e.g., lines, traces, pads, vias) positioned on a side of the FEOL structure 110 opposite the base material 106. As a specific, non-limiting example, the BEOL structure 130 may include one or more metallization structures (e.g., metallization materials) M1, M2, M3, M4, M5, M6, M7 each including one or more conductive structures (e.g., conductive plugs, conductive landing pads, conductive bond pads, conductive pillars, conductive contacts) 132 located within a dielectric material 134. In some embodiments, at least some of the conductive structures 132 may be in electrical communication with the conductive pillars 124. The conductive structures 132 may facilitate routing of signals or power laterally (left and right in the view of FIG. 1A; and into and out of the page in the view of FIG. 1A) across the BEOL structure 130 and/or longitudinally (up and down in the view of FIG. 1A) through the BEOL structure 130.

One or more conductive elements 136, for example in the form of solder-capped copper pillars, may be located on the front side 101 of the microelectronic device 100. The conductive element 136 may be in electrical communication with at least some of the conductive structures 132. In some embodiments, the conductive element 136 may comprise a terminal of a capacitor structure 150 within the back side 103 of the die 105, as will be described herein. The capacitor structure 150 may comprise, for example, a decoupling structure and may be referred to herein as a decoupling capacitor.

With continued reference to FIG. 1A, the microelectronic device 100 may include one or more decoupling capacitors 150 located on the back side 103 of the die 105. The decoupling capacitors 150 may be electrically isolated from the base material 106, such as by an insulative material configured as a liner material 148. The insulative liner material 148 may comprise one or more dielectric materials, such as one or more of silicon dioxide, silicon nitride, phosphosilicate glass, borosilicate glass, borophosphosilicate glass, fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the insulative liner material 148 comprises silicon dioxide.

The decoupling capacitors 150 may be electrically connected to conductive vias (e.g., through silicon vias (TSVs), through substrate vias) that are electrically coupled to the front side 101 of the microelectronic device 100. Although FIG. 1A illustrates a single decoupling capacitor 150 on the back side 103, the disclosure is not so limited. It will be understood that the back side 103 may include any number of decoupling capacitors 150.

The decoupling capacitor 150 may include, for example, a first electrode 152, a dielectric material 154 adjacent to the first electrode 152, and a second electrode 156 adjacent to the dielectric material 154. The dielectric material 154 may be directly between the first electrode 152 and the second electrode 156.

The first electrode 152 and the second electrode 156 may each independently comprise an electrically conductive material. For example, the first electrode 152 and the second electrode 156 may independently be formed of and include one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the first electrode 152 and the second electrode 156 are independently formed of and include tungsten. In other embodiments, the first electrode 152 and the second electrode 156 are independently formed of and include copper.

The dielectric material 154 may be formed of and include one or more of silicon dioxide, silicon nitride, zirconium oxide, hafnium oxide, aluminum oxide ($Al_2O_3$), yttrium oxide ($Y_2O_3$), scandium oxide ($Sc_2O_3$), lanthanum oxide ($La_2O_3$), tantalum oxide ($Ta_2O_5$), titanium oxide ($TiO_2$), zirconium silicate ($ZrSiO_4$), hafnium silicate ($HfSiO_4$), yttrium orthoaluminate (also referred to as yttrium aluminum perovskite; $YAlO_3$), hafnium aluminum oxide ($HfAlO_3$), lanthanum aluminate ($LaAlO_3$), or hafnium silicon oxynitride (HfSiON). In some embodiments, the dielectric material 154 is formed of and includes silicon dioxide.

The first electrode 152 may be in electrical communication with the front side 101 of the microelectronic device 100 by means of a first conductive via 160. In some embodiments, the first conductive via 160 directly contacts the first electrode 152. The first conductive via 160 may include a conductive material 162 extending through the microelectronic device 100, such as through the dielectric material 114. In some embodiments, the first conductive via 160 extends through the FEOL structure 110. Although FIG. 1A illustrates that the conductive material 162 terminates at the BEOL structure 130, it will be understood that the BEOL structure 130 may include conductive structures 132 in electrical communication with the conductive material 162 for providing electrical communication between the conductive material 162 of the first conductive via 160 to the front side 101 of the microelectronic device 100. For example, the conductive structure 132 in electrical communication with the first conductive via 160 may be in electrical communication with the front side 101 through other conductive structures 132 that are not illustrated in the cross-sectional view of FIG. 1A. As one example, a conductive path between the first conductive via 160 and the front side 101 may be routed to another cross-section than the cross-section illustrated in FIG. 1A through one or more redistribution lines or redistribution structures. In some embodiments, the first conductive via 160 is in electrical communication with the front side 101 through the conductive trace 126 and one or more conductive structures 132.

A barrier material 164 may be adjacent to the conductive material 162 and a dielectric material 165 may be adjacent to the barrier material 164. The barrier material 164 may be formulated and configured to prevent materials (e.g., atoms) of the conductive material 162 from diffusing out of (e.g., away) from the conductive material 162. The barrier material 164 may be formed of and include, for example, one or more of titanium nitride, tantalum nitride, titanium zirconium nitride, tungsten nitride, or another material. The dielectric material 165 may be formed of and include, for example, one or more of silicon dioxide, silicon nitride, silicon oxynitride, or another material.

The second electrode 156 may be in electrical communication with a redistribution line (RDL) 166 on the back side 103 of the microelectronic device 100. The redistribution line 166 may be formed of and include an electrically conductive material, such as one or more of the materials described above with reference to the conductive material 162. In some embodiments, the redistribution line 166 is formed of and includes copper. In other embodiments, the redistribution line 166 is formed of and includes tungsten.

The redistribution line 166 may be in electrical communication with a second conductive via 170. The second conductive via 170 may be formed of and include materials as described with reference to the first conductive via 160. The second conductive via 170 may be in electrical communication with the back side 103 and the front side 101 of the microelectronic device 100. For example, the second conductive via 170 may extend through the dielectric material 114 and may be in electrical communication with the front side 101 through the conductive structures 132, the conductive trace 126, or a combination of the conductive trace 126 and the conductive structures 132. In some embodiments, the second conductive via 170 extends through the FEOL structure 110. In some embodiments, the second conductive via 170 is in electrical communication with the conductive element 136, which may comprise a terminal of the decoupling capacitor 150.

In some embodiments, the second electrode 156 may be laterally offset from the second conductive via 170. The redistribution line 166 may be configured to redistribute (re-route) an electrical signal from the front side 101 through the second conductive via 170 and to the second electrode 156, which may be located at a different lateral position on the back side 103 than the terminal on the front side 101.

In some embodiments, the first conductive via 160 may be in electrical communication with a first terminal (not shown in the cross-section of FIG. 1A) on the front side 101 and the second conductive via 170 may be in electrical communication with a second terminal (e.g., the conductive element 136) on the front side 101. The first terminal and the second terminal may, in turn, be in electrical communication with various components of the microelectronic device 100 or with a power source. By way of non-limiting example, one of the first terminal and the second terminal may be in electrical communication with an electrical ground and the other of the first terminal and the second terminal may be in electrical communication with one or more components of the active circuitry (e.g., one or more of the capacitors in the FEOL structure 110). In some such embodiments, the decoupling capacitors 150 may be configured to store a charge during switching of a logic load of the active circuitry (e.g., memory devices) of the microelectronic device 100 and may control the voltage variation of the microelectronic device 100 and facilitate a constant power supply to the microelectronic device 100 and to components thereof. In other embodiments, one of the first terminal and the second terminal may be in electrical communication with a positive supply voltage (e.g., a $V_{DD}$ voltage) and the other of the first terminal and the second terminal may be in electrical communication with a second supply voltage (e.g., a $V_{SS}$ voltage). In some embodiments, the decoupling capacitors 150 may be configured to electrically isolate transistors 112 from adjacent active circuitry (such as adjacent transistors 112, adjacent power supply, or from adjacent electrically conductive lines electrically connected to adjacent active circuitry (e.g., adjacent transistors 112) or power supply).

A dielectric material 172 may be adjacent to the redistribution line 166 and may electrically isolate the redistribution line 166 from other components of the microelectronic device 100. The dielectric material 172 may include one or more of silicon dioxide, silicon nitride, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the dielectric material 172 comprises silicon dioxide.

Accordingly, the microelectronic device 100 may include one or more decoupling capacitors 150 located on the back side 103 of the microelectronic device 100. Since the decoupling capacitor 150 is located on the back side 103, the decoupling capacitor 150 may occupy more area of the die 105 than conventional microelectronic devices in which decoupling capacitors are formed in the FEOL structure or the front side of the microelectronic device. In addition, since the decoupling capacitor 150 is formed in the back side 103, the decoupling capacitor 150 may be fabricated with lower cost and complexity processing methods, as compared to conventional decoupling capacitors formed in the front side since the back side 103 may not include as closely spaced components as the front side. In addition, in some embodiments, a larger portion (e.g., substantially an entire portion) of the back side 103 may be available in which to form the decoupling capacitor 150 compared to only a small portion of the front side 101. Further, since the decoupling capacitor 150 is formed in the back side 103 of the die 105, the decoupling capacitor 150 does not directly impact formation of the active circuitry, such as in the FEOL structure 110.

The decoupling capacitor 150 may be formed in the base material 106 without adding to the thickness (in the vertical direction in the view of FIG. 1A). In other words, the decoupling capacitor 150 does not thin the base material 106, which would otherwise reduce the impedance of the microelectronic device 100, reducing the performance of the microelectronic device 100. Since the thickness of the base material 106 is not thinned due to the presence of the decoupling capacitor 150, the microelectronic device 100 may not exhibit a reduction in die break strength.

Figure 1B:
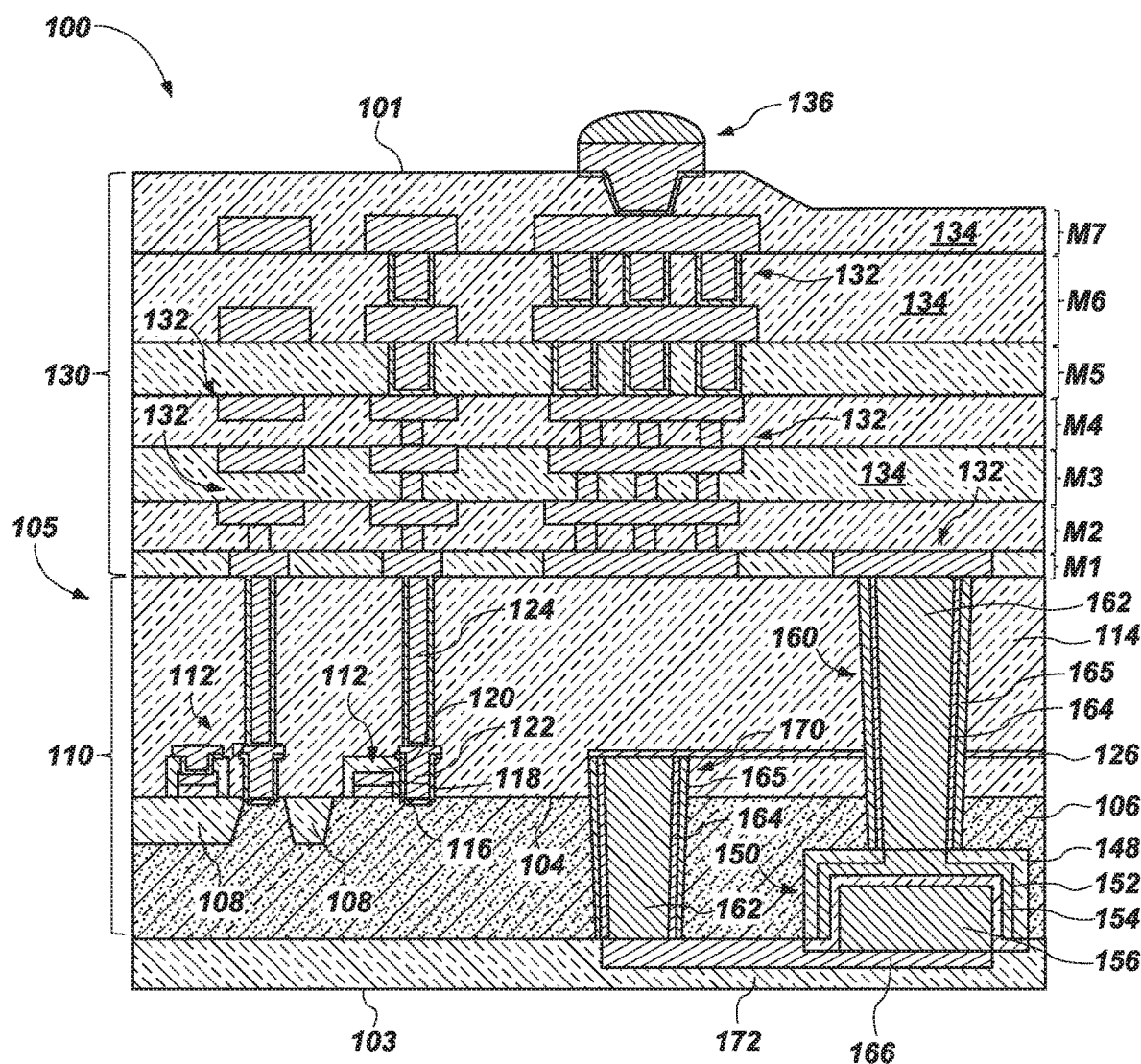
FIG. 1B is a simplified cross-sectional view of a microelectronic device, in accordance with embodiments of the disclosure.

In some embodiments, one or both of the first conductive via 160 and the second conductive via 170 may be in electrical communication with the front side 101 with a conductive trace (e.g., the conductive trace 126). With reference to FIG. 1B, in some embodiments, the second conductive via 170 may be in electrical communication with the front side 101 through the conductive trace 126. In some embodiments, the conductive trace 126 may route signals from the second conductive via 170 to be laterally offset (e.g., left and right in the view of FIG. 1B) on the front side 101 from the second conductive via 170 proximate the back side 103.

Figure 2A:
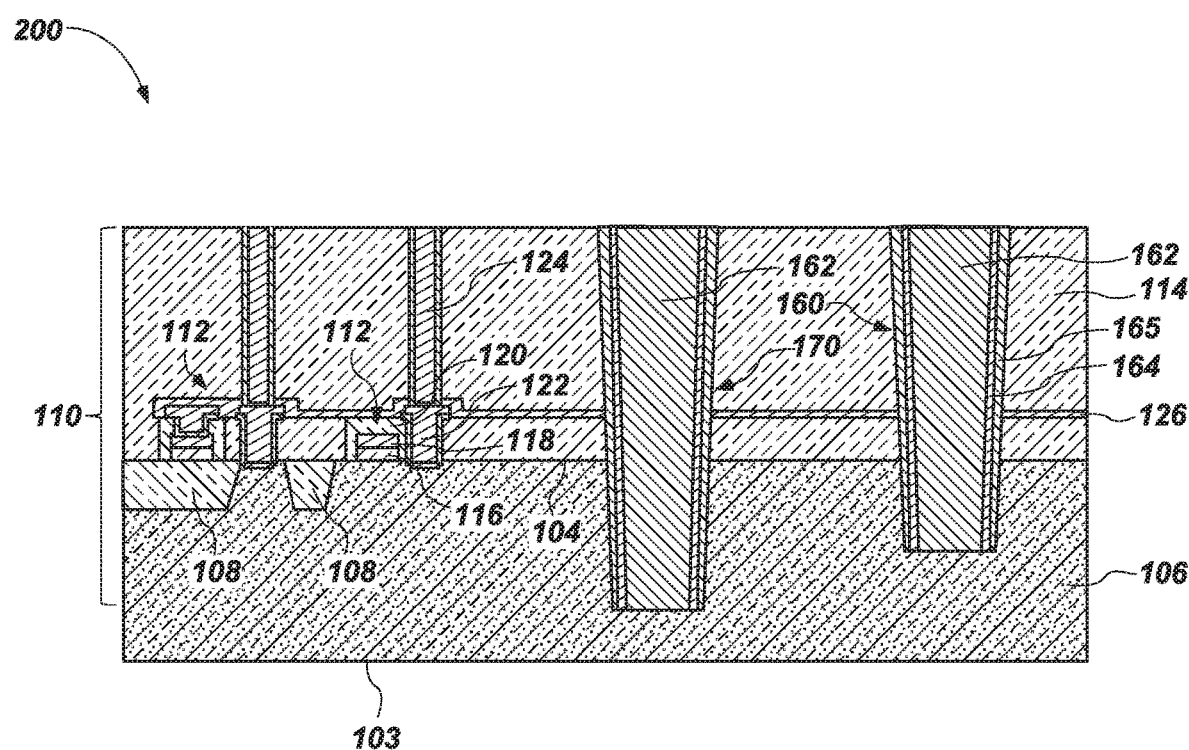
FIG. 2A through FIG. 2E are simplified cross-sectional views of a microelectronic device structure illustrating a method of forming the microelectronic device of FIG. 1A, in accordance with embodiments of the disclosure.

FIG. 2A through FIG. 2E are simplified cross-sectional views of a microelectronic device structure 200 illustrating a method of forming the microelectronic device 100 of FIG. 1A, in accordance with embodiments of the disclosure. With reference to FIG. 2A, the microelectronic device structure 200 includes the FEOL structure 110 including the base material 106. The FEOL structure 110 may be substantially the same as the FEOL structure described above with reference to FIG. 1A and FIG. 1B. As described above, in some embodiments, one of the first conductive via 160 and the second conductive via 170 may be in electrical communication with the conductive trace 126.

Active circuitry may be formed within and adjacent to base material 106. For example, one or more of capacitors, transistors (e.g., transistors 112), electrodes, diodes, memory cells, resistors, metal structures, conductive lines (access lines, digit lines, word lines), redistribution lines, and other components circuitry may be formed within and adjacent to the base material 106. The active circuitry may be formed by conventional techniques and processes.

In some embodiments, the first conductive via 160 and the second conductive via 170 may be formed by a so-called "via-first" process wherein the first conductive via 160 and the second conductive via 170 are formed prior to formation of the active circuitry in the FEOL structure 110. In other embodiments, the first conductive via 160 and the second conductive via 170 may be formed by a so-called "via-middle" process wherein the first conductive via 160 and the second conductive via 170 are formed after the active circuitry is formed, but prior to formation of the BEOL structure 130. In yet other embodiments, the first conductive via 160 and the second conductive via 170 are formed by a so-called "via-last" process wherein the first conductive via 160 and the second conductive via 170 are formed after or during formation of the BEOL structure 130. In some embodiments, the first conductive via 160 and the second conductive via 170 are formed prior to flipping the microelectronic device structure 200 and performing processing acts on the back side 103 of the microelectronic device structure 200.

Figure 2B:
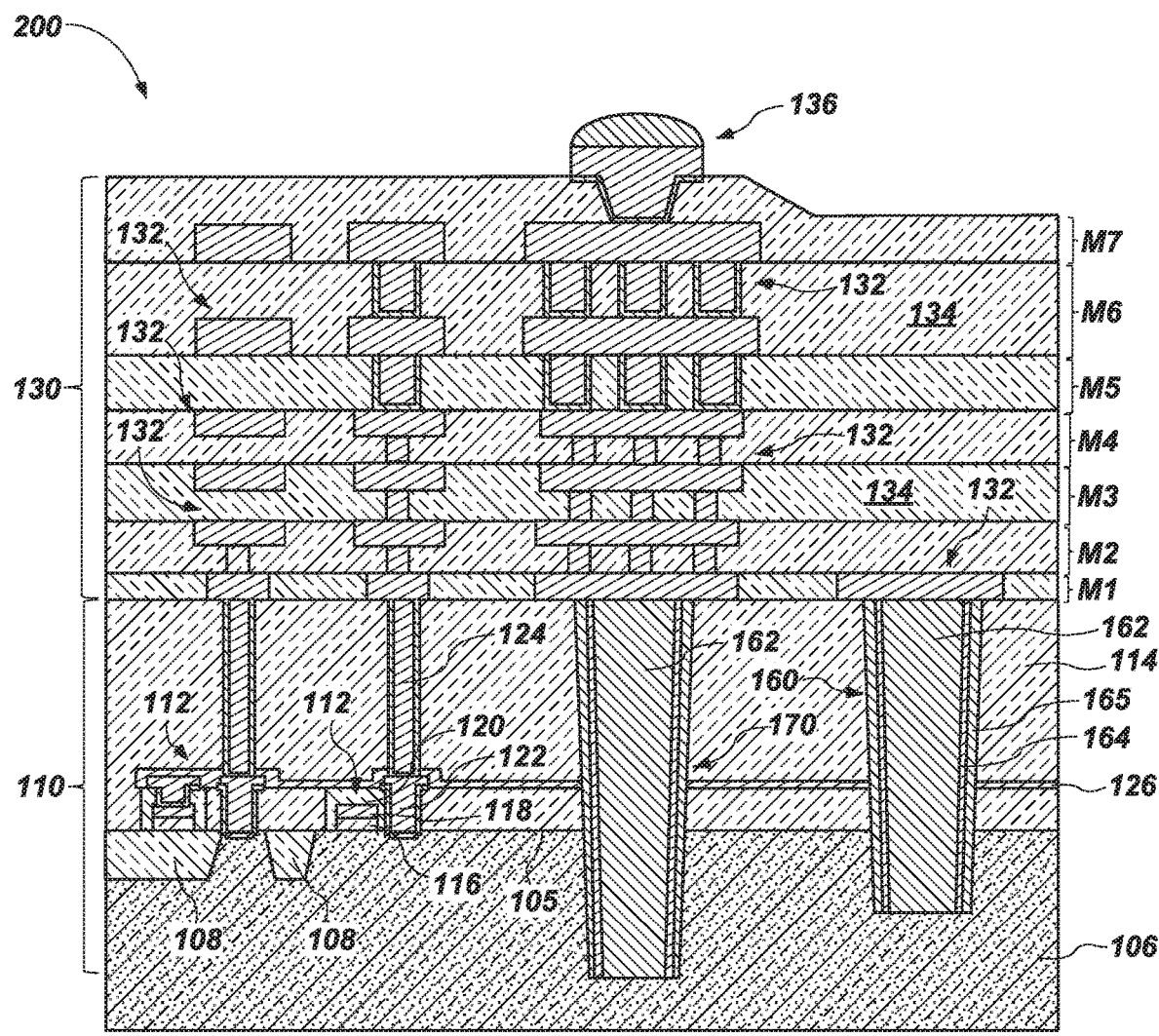

Referring to FIG. 2B, after forming the base material 106 and the FEOL structure 110, the BEOL structure 130 may be formed adjacent to the FEOL structure 110. The BEOL structure 130 may be substantially the same as the BEOL structure 130 described above with reference to FIG. 1A and FIG. 1B. The BEOL structure 130 may be formed by, for example, forming the first metallization structure M1 adjacent to (e.g., over) the FEOL structure 110. The first metallization structure M1 may be formed by, for example, forming the dielectric material 134 over the FEOL structure 110, forming openings in the dielectric material 134, and forming the conductive structures 132 in the openings. A desired number of metallization structures M2, M3, M4, M5, M6, M7 may be similarly formed adjacent to (e.g., over) the first metallization structure M1 and adjacent to the FEOL structure 110 to form the BEOL structure 130 and route electrical pathways to desired locations within the microelectronic device structure 200. The metallization structures M1, M2, M3, M4, M5, M6, M7 may be formed by conventional techniques. After forming the desired number of metallization structures M1, M2, M3, M4, M5, M6, M7, conductive elements 136 or other conductive structures may be formed on the exposed surface of the microelectronic device structure 200.

Figure 2C:
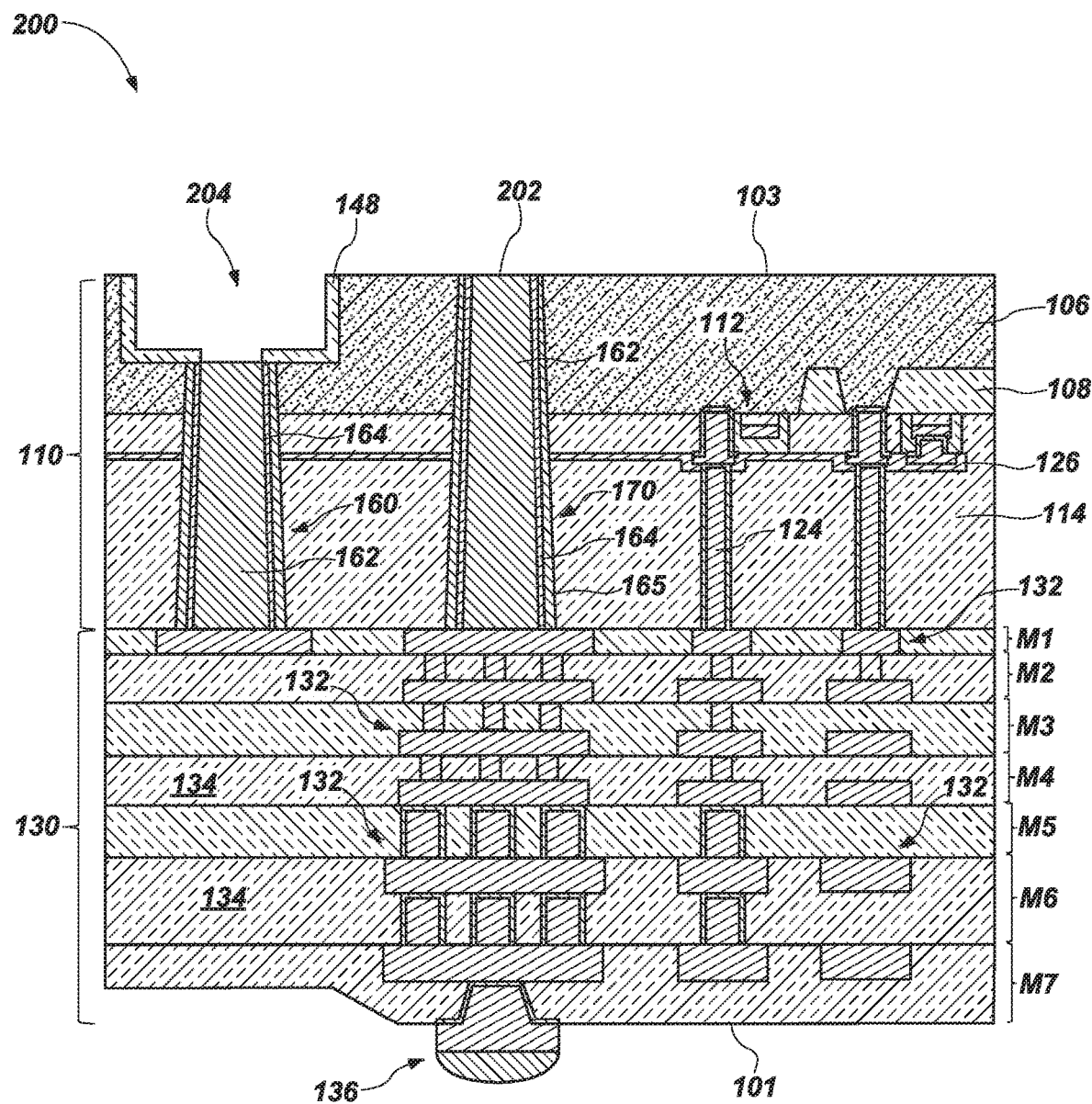

With reference to FIG. 2C, after forming the BEOL structure 130, processing acts may be conducted on the back side 103. For convenience, FIG. 2C shows the microelectronic device structure 200 inverted (e.g., flipped) relative to FIG. 2B. In some embodiments, a portion of the base material 106 may be removed (e.g., thinned), such as by chemical mechanical planarization (CMP). In some embodiments, removing a portion of the base material 106 may expose a portion of at least the second conductive via 170. For example, surface 202 of the second conductive via 170 may be exposed after exposing the back side 103 to the CMP process.

A recess 204 may be formed in the base material 106 to expose a portion of the first conductive via 160. By way of non-limiting example, a mask material (e.g., a photomask) may be formed over the base material 106 and an opening (corresponding to the location of the recess 204) may be formed in the mask material. The recess 204 may be formed through the mask material, such as by photolithography techniques.

After forming the recess 204, the insulative liner material 148 may be formed within the recess 204. The insulative liner material 148 may be formed by one or more of spin coating, blanket coating, CVD, ALD, plasma enhanced ALD, PVD, PECVD, or LPCVD. After forming the insulative liner material 148, at least a portion of the insulative liner material 148 may be removed to expose the conductive material 162 of the first conductive via 160.

Figure 2D:
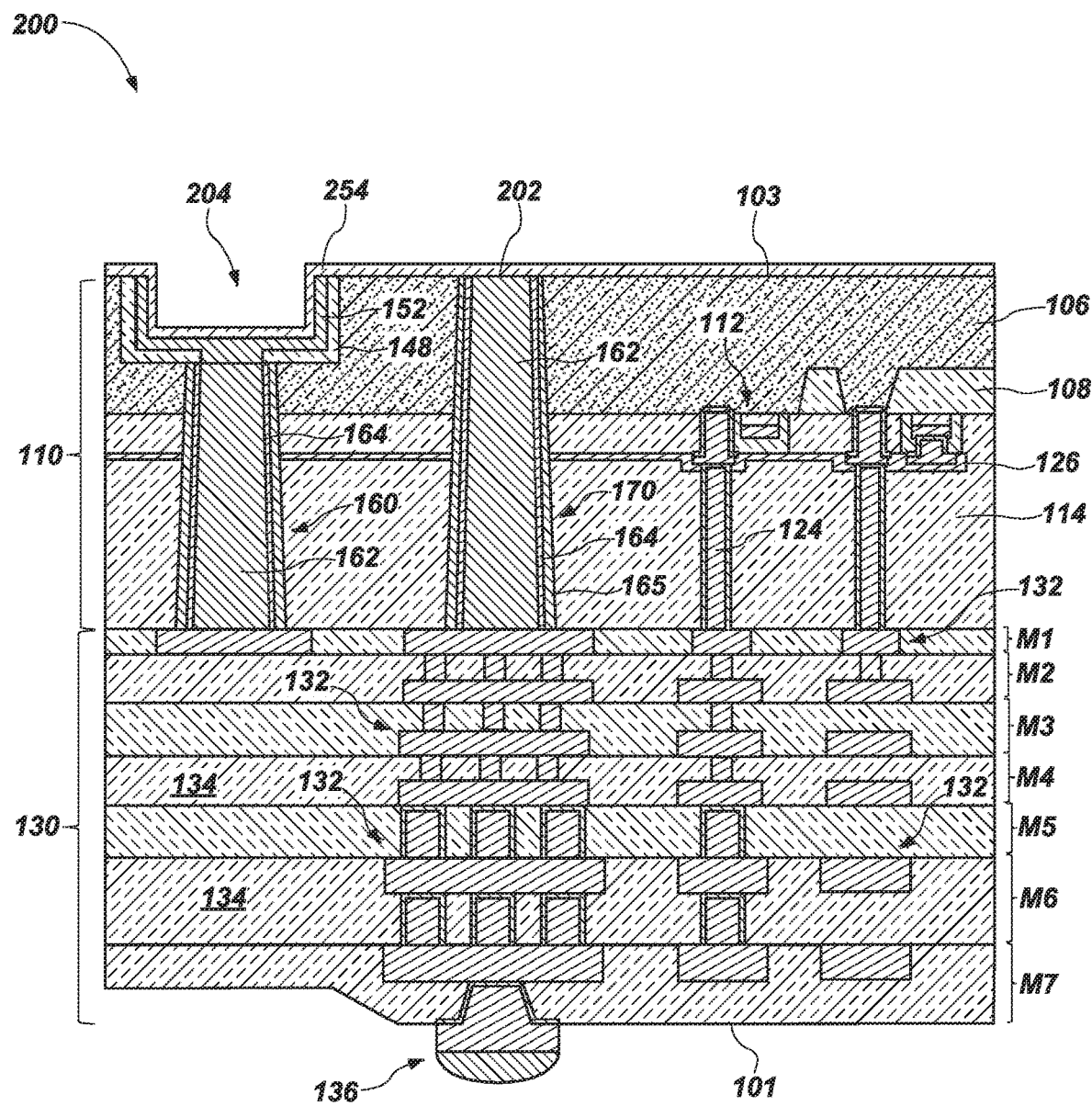

Referring to FIG. 2D, a conductive material may be formed and patterned within the recess 204 to form the first electrode 152. By way of non-limiting example, the conductive material may be formed by one or more of coating, blanket coating, CVD, ALD, plasma enhanced ALD, PVD, PECVD, or LPCVD. After forming the conductive material, portions of the conductive material over surfaces of the base material 106 may be removed (e.g., such as by CMP) to form the first electrode 152. The first electrode 152 may include surfaces extending along sidewalls of the insulative liner material 148 within the recess 204.

After forming the first electrode 152, a dielectric material 254 may be formed within the recess 204 and over the base material 106. The dielectric material 254 may include one or more of the materials described above with reference to the dielectric material 154 (FIG. 1A, FIG. 1B). In some embodiments, the dielectric material 254 comprises silicon dioxide. The dielectric material 254 may be formed by one or more of coating, blanket coating, CVD, ALD, plasma enhanced ALD, PVD, PECVD, or LPCVD.

Figure 2E:
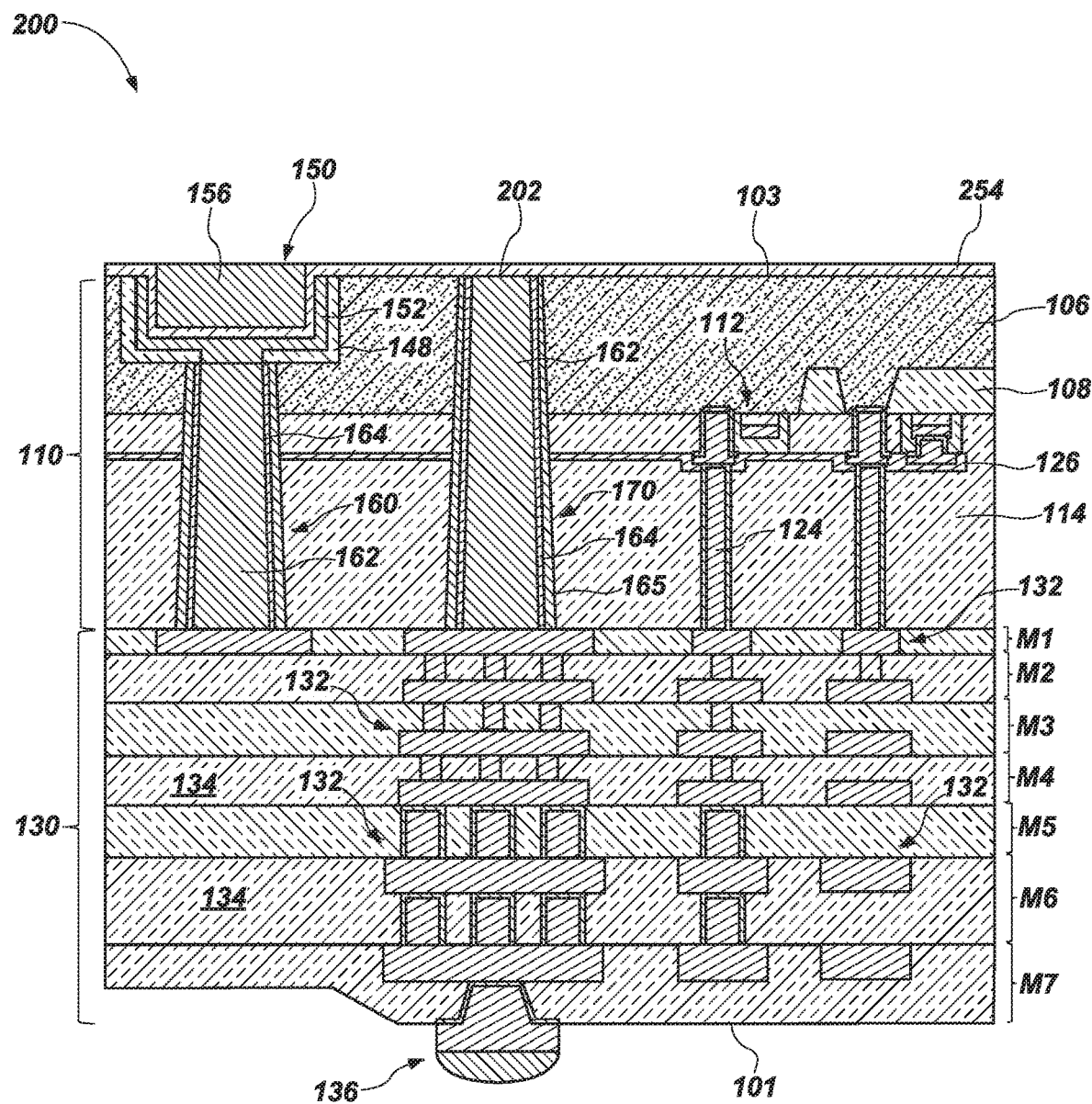

Referring to FIG. 2E, after forming the dielectric material 254, a conductive material may be formed within the recess 204 (FIG. 2D) to form the second electrode 156. The conductive material may be formed by one or more of coating, blanket coating, CVD, ALD, plasma enhanced ALD, PVD, PECVD, or LPCVD. In other embodiments, the second electrode 156 is formed by electrochemical deposition (ECD) or by electrochemical deposition plating. Formation of the second electrode 156 may form the decoupling capacitor 150 in the back side 103 of the microelectronic device structure 200.

After forming the second electrode 156, a conductive material may be formed in electrical communication with the second electrode 156 and the first conductive via 160 to form the redistribution line 166 (FIG. 1A, FIG. 1B). In some embodiments, a mask material may be formed over the microelectronic device structure 200 and patterned to include openings at locations corresponding to the location of the redistribution line 166.

After forming the mask material, portions of the dielectric material 254 exposed through the mask material may be removed. For example, the dielectric material 254 may be removed by exposing portions of the dielectric material 254 to one or more of hydrofluoric acid or a dry etchant comprising, for example, sulfur hexafluoride ($SF_6$), nitrogen trifluoride ($NF_3$), carbon tetrafluoride ($CF_4$), oxygen, trifluoromethane (also referred to as fluoroform; $CHF_3$), hexafluoroethane ($C_2F_6$), perfluoropropane ($C_3F_8$), or perfluorocyclopentene (also referred to as octafluorocyclopentene; $C_5F_8$).

After forming the redistribution line 166, the dielectric material 172 (FIG. 1A, FIG. 1B) may be formed over the base material 106 and redistribution line 166 of the microelectronic device structure 200 to form the microelectronic device 100 of FIG. 1A. The dielectric material 172 may be formed by one or more of coating, blanket coating, CVD, ALD, plasma enhanced ALD, PVD, PECVD, or LPCVD. In some embodiments, the dielectric material 172 has the same material composition as the dielectric material 254 and is illustrated as a single material in FIG. 1A. It will be understood that in other embodiments, the dielectric material 172 and the dielectric material 254 may comprise different material compositions.

Although FIG. 1A, FIG. 1B, and FIG. 2A through FIG. 2E have been described and illustrated as including the decoupling capacitor 150 having a particular configuration, the disclosure is not so limited. FIG. 3A through FIG. 3E, are simplified cross-sectional views of a microelectronic device structure 300 illustrating a method of forming a microelectronic device comprising a decoupling capacitor, in accordance with embodiments of the disclosure.

Figure 3A:
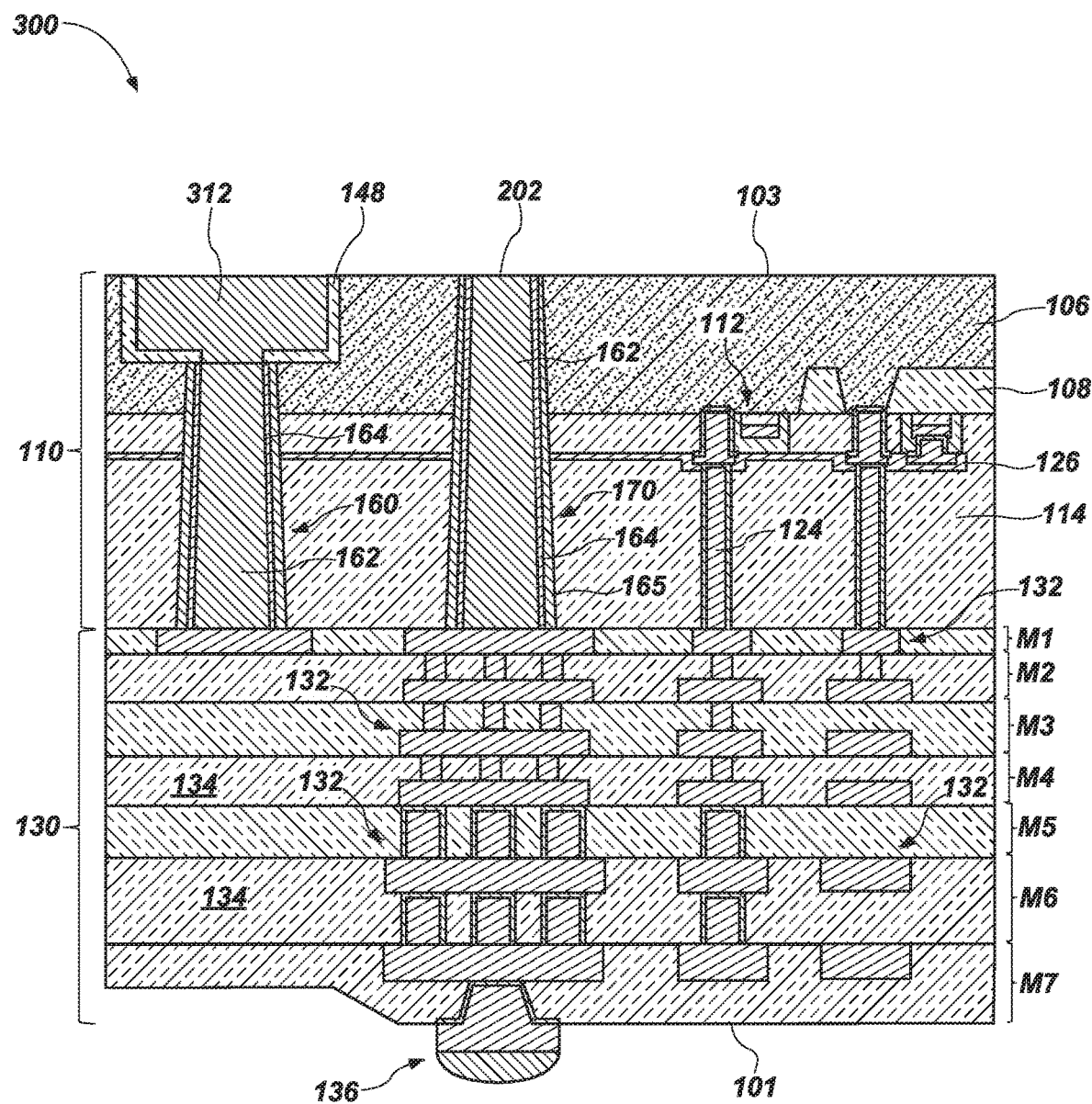
FIG. 3A through FIG. 3E, are simplified cross-sectional views of a microelectronic device structure illustrating a method of forming a microelectronic device comprising a decoupling capacitor, in accordance with embodiments of the disclosure.

FIG. 3A is a simplified cross-sectional view of a microelectronic device structure 300. The microelectronic device structure 300 may be formed in substantially the same manner and may be substantially the same as the microelectronic device structure 200 described above with reference to FIG. 2C. For example, after forming the FEOL structure 110 adjacent the base material 106, the BEOL structure 130 may be formed adjacent the FEOL structure 110, and the microelectronic device structure 300 may be flipped. After flipping the microelectronic device structure 300, the recess 204 may be formed in the base material 106 and the insulative liner material 148 may be formed within the recess 204, as described above with reference to FIG. 2C.

With reference to FIG. 3A, after forming the insulative liner material 148 within the recess 204, a conductive material 312 may be formed within the recess 204 (FIG. 2C). The conductive material 312 may include one or more electrically conductive materials, such as one or more of the materials described above with reference to the first electrode 152 (FIG. 1A, FIG. 1B). The conductive material 312 may substantially completely fill the recess 204. In some embodiments, the conductive material 312 is formed of and includes copper. In other embodiments, the conductive material 312 is formed of and includes tungsten. Exposed surfaces of the microelectronic device structure 300 may be exposed to a CMP process to substantially planarize the conductive material 312. In some embodiments, the exposed surface of the conductive material 312 may be substantially coplanar with the exposed surface of the base material 106.

Figure 3B:
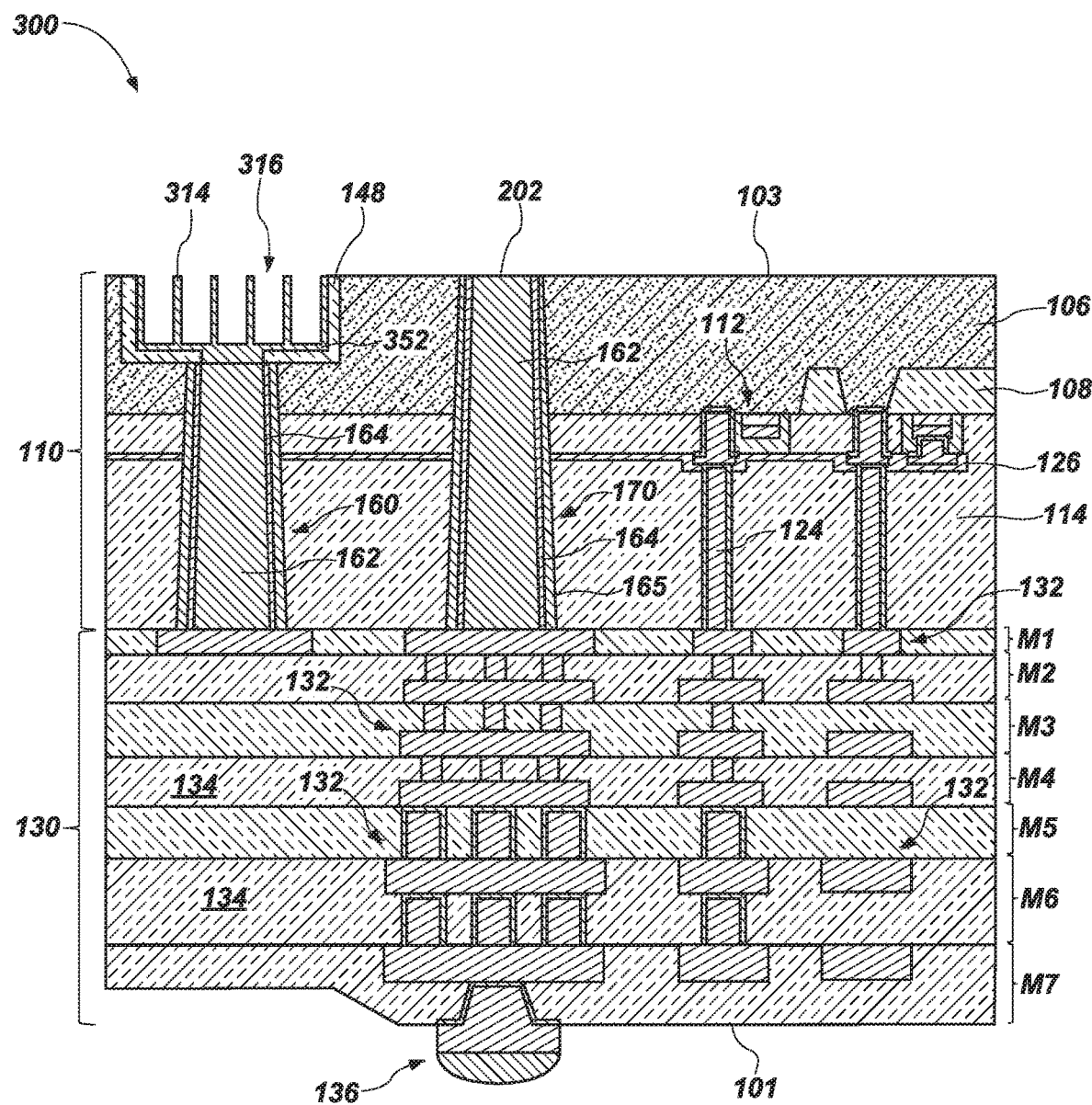

Referring to FIG. 3B, portions of the conductive material 312 may be removed to form a first electrode 352 comprising fingers 314 of the conductive material 312 separated by gaps 316. The first electrode 352 may be formed by, for example, forming a mask material over the microelectronic device structure 300. Openings may be formed through the mask material corresponding to the location of the gaps 316 to expose the conductive material 312 through the openings of the mask material. The exposed portions of the conductive material 312 may be removed through the openings in the mask material to form the gaps 316. After forming the gaps 316, the mask material may be removed.

Figure 3C:
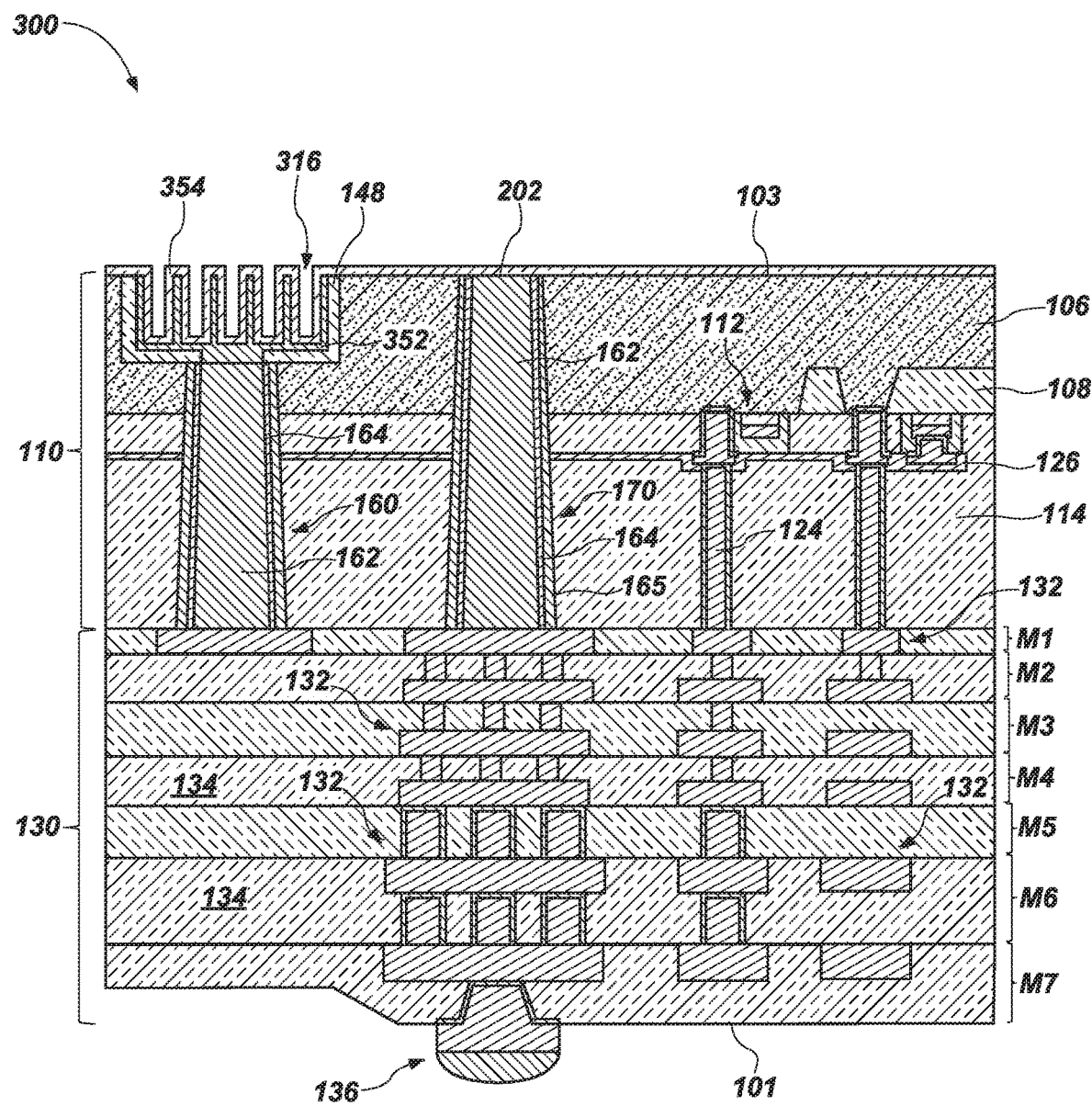

With reference to FIG. 3C, a dielectric material 354 may be formed over the first electrode 352. In some embodiments, the dielectric material 354 is formed conformally over the first electrode 352 and may not completely fill the gaps 316. The dielectric material 354 may be formed by one or more of coating, blanket coating, CVD, ALD, plasma enhanced ALD, PVD, PECVD, or LPCVD. In some embodiments, the dielectric material 354 is formed by ALD. In other embodiments, the dielectric material 354 is formed by CVD. In some embodiments, the dielectric material 354 is formed over exposed surfaces of the base material 106.

The dielectric material 354 may comprise one or more of the materials described above with reference to the dielectric material 154 (FIG. 1A, FIG. 1B). In some embodiments, the dielectric material 354 comprises silicon dioxide.

Figure 3D:
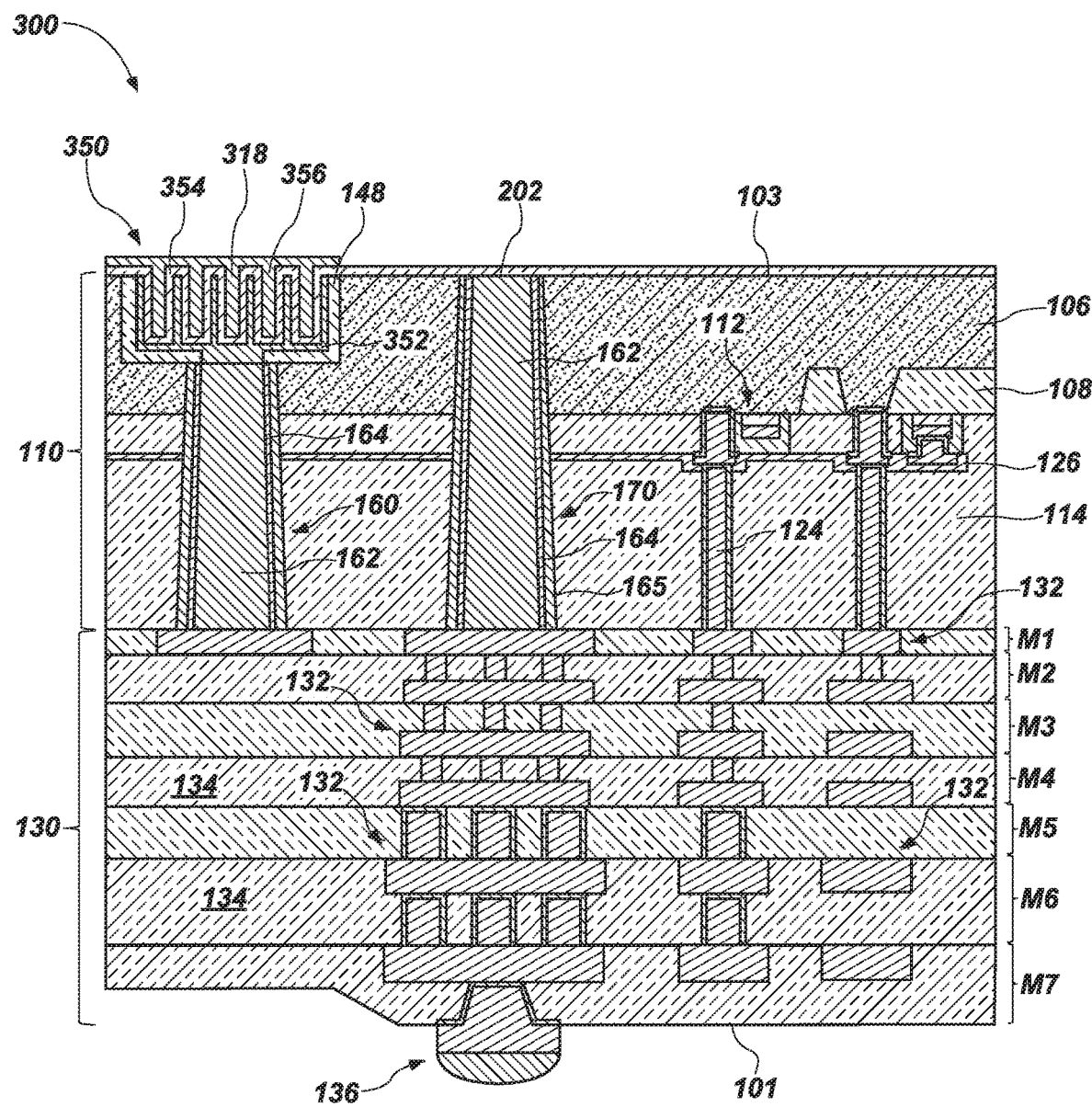

Referring to FIG. 3D, after forming the dielectric material 354, a second electrode 356 may be formed within the gaps 316 (FIG. 3C) and over the dielectric material 354 to form a decoupling capacitor 350. The second electrode 356 may comprise one or more of the electrically conductive materials described above with reference to the second electrode 156 (FIG. 1A, FIG. 1B). The second electrode 356 may substantially fill remaining portions of the gaps 316 (FIG. 3C) and may comprise fingers 318. In some embodiments, the first electrode 352 and the second electrode 356 may comprise so-called "interdigitated electrodes," each comprising portions (e.g., fingers 314, 318) located between adjacent portions (e.g., fingers 314, 318) of the other electrode and separated by the dielectric material 354. In some embodiments, the second electrode 356 comprises copper. In other embodiments, the second electrode 356 comprises tungsten.

Figure 3E:
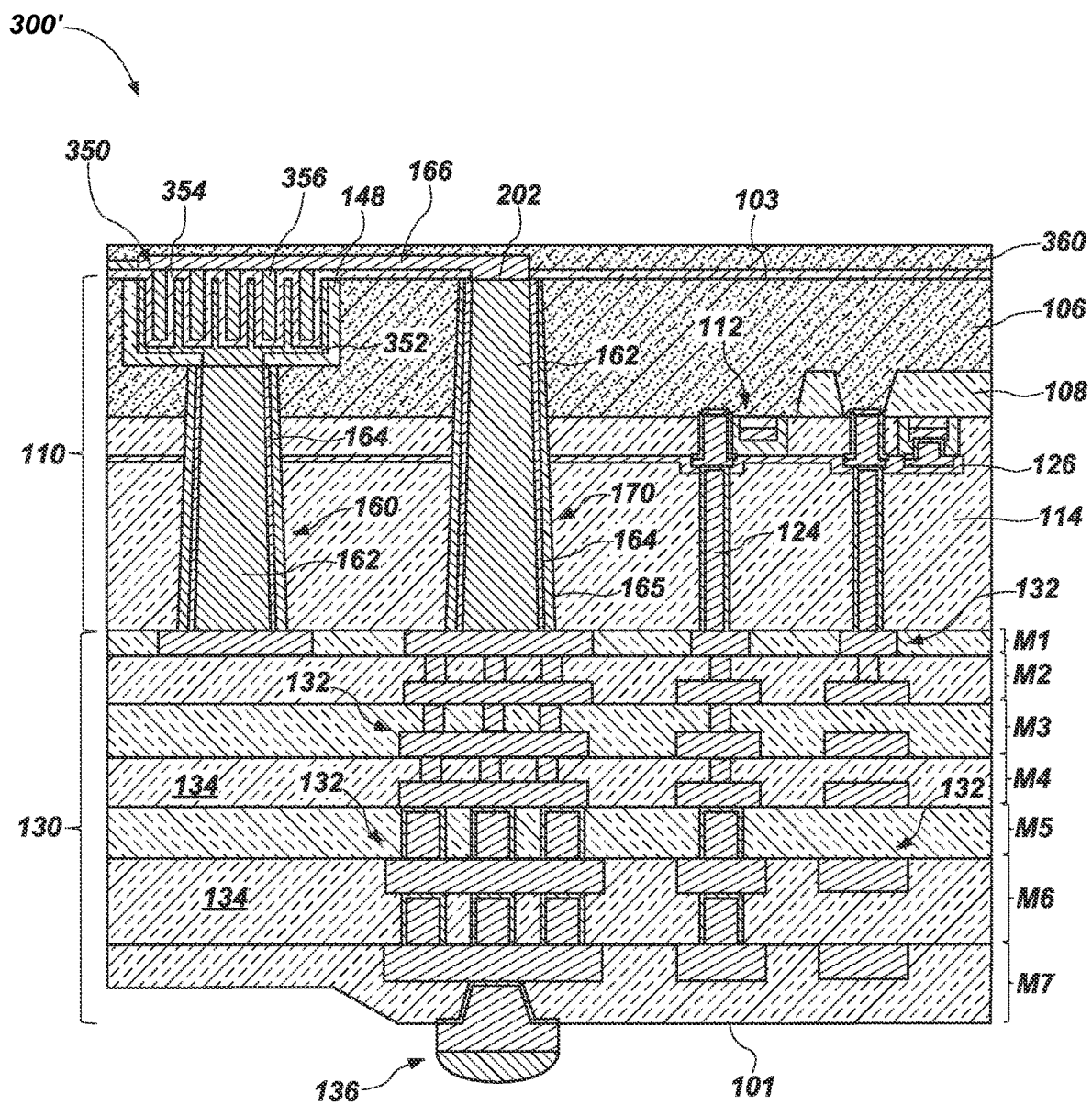

With reference to FIG. 3E, after forming the second electrode 356, an opening may be formed in the dielectric material 354 over the second conductive via 170 to expose the conductive material 162. After exposing the conductive material 162, the redistribution line 166 may be formed over the second electrode 356 and extending between the conductive material 162 of the second conductive via 170 and the second electrode 356. After forming the redistribution line 166, a dielectric material 360 may be formed over the microelectronic device structure 300 to form a microelectronic device 300'. The dielectric material 360 may comprise, for example, one or more of silicon dioxide, silicon nitride, phosphosilicate glass, borosilicate glass, borophosphosilicate glass (BPSG), fluorosilicate glass, a nitride material, an oxynitride (e.g., silicon oxynitride, another dielectric material, a dielectric carbon nitride material (e.g., silicon carbon nitride (SiCN)), and a dielectric carboxynitride material (e.g., silicon carboxynitride (SiOCN)). In some embodiments, the dielectric material 360 comprises silicon dioxide.

Figure 4A:
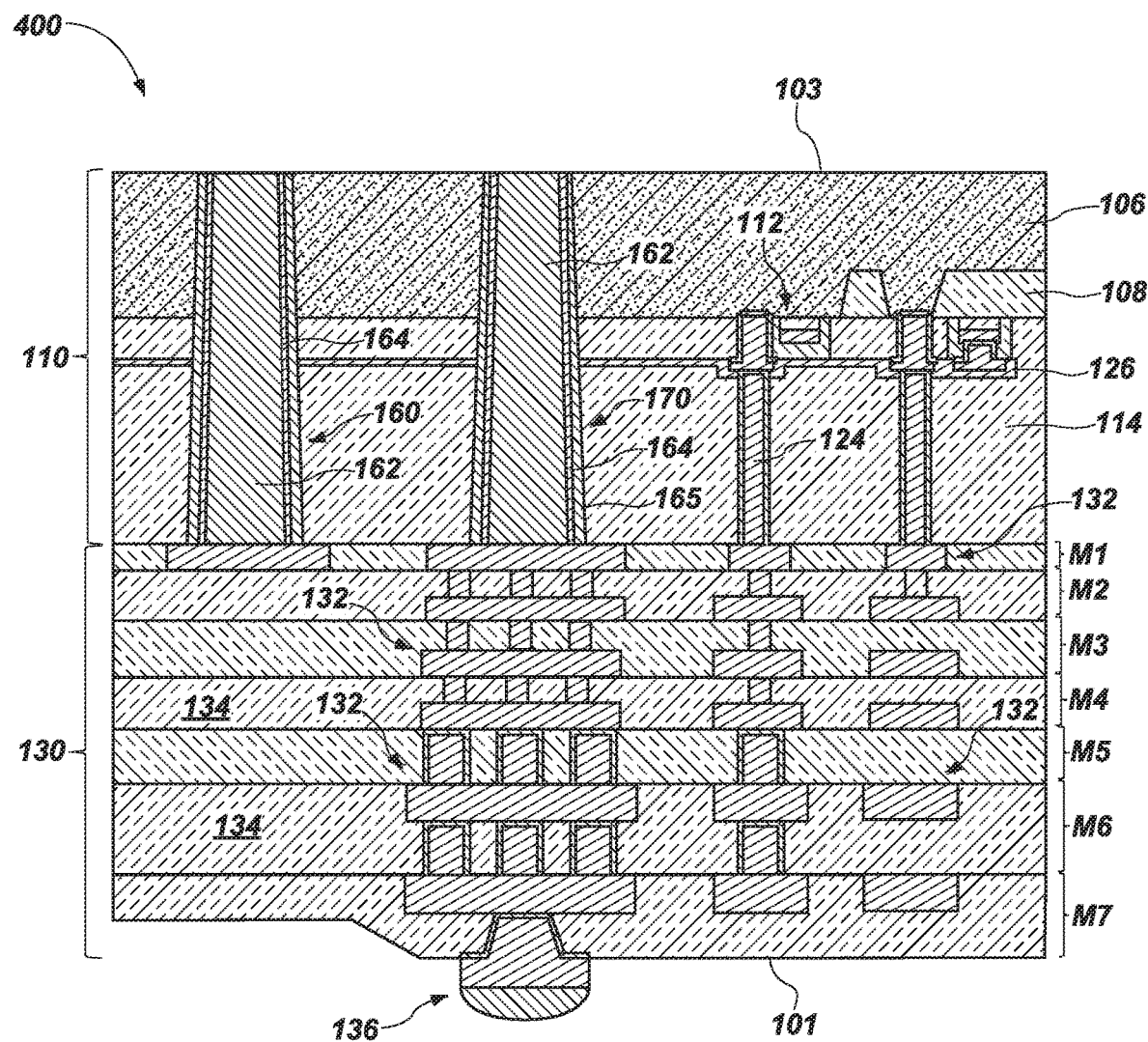
FIG. 4A through FIG. 4E are simplified cross-sectional views of a microelectronic device structure illustrating a method of forming a microelectronic device, in accordance with other embodiments of the disclosure.

FIG. 4A through FIG. 4E are simplified cross-sectional views of a microelectronic device structure 400 illustrating a method of forming a microelectronic device, in accordance with other embodiments of the disclosure. FIG. 4A is a simplified cross-sectional view of a microelectronic device structure 400. The microelectronic device structure 400 may be formed in substantially the same manner and may be substantially the same as the microelectronic device structure 200 described above with reference to FIG. 2C, except that the recess 204 (FIG. 2C) may not be formed in the back side 103 of the microelectronic device structure 400. For example, after forming the FEOL structure 110 adjacent the base material 106 and forming the BEOL structure 130 adjacent the FEOL structure 110, the microelectronic device structure 400 may be flipped. After flipping the microelectronic device structure 400, a portion of the base material 106 may be removed (e.g., thinned) to expose the conductive material 162 of each of the first conductive via 160 and the second conductive via 170.

Figure 4B:
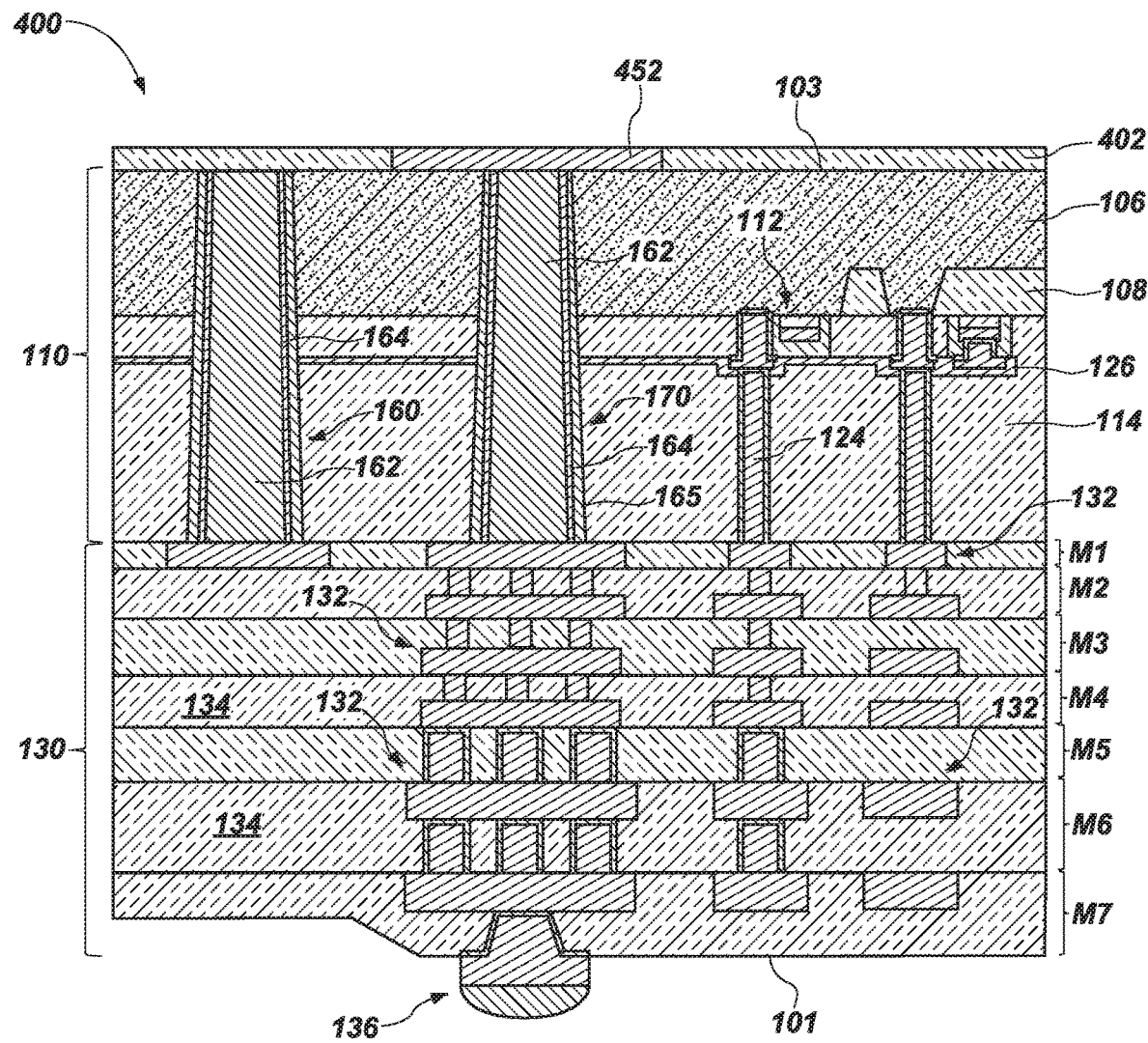

With reference to FIG. 4B, after exposing the first conductive via 160 and the second conductive via 170, electrical contacts may be individually formed to each of the first conductive via 160 and the second conductive via 170. In some embodiments, a dielectric material 402 is formed over the base material 106 and an opening is formed through the dielectric material 402 to expose the conductive material 162 of the second conductive via 170. In some embodiments, the dielectric material 402 is adjacent to (e.g., overlies) the conductive material 162 of the first conductive via 160.

A conductive material may be formed in the opening in the dielectric material 402 to form a first electrode 452. The first electrode 452 may include one or more of the electrically conductive materials described above with reference to the first electrode 152 (FIG. 1A, FIG. 1B).

Figure 4C:
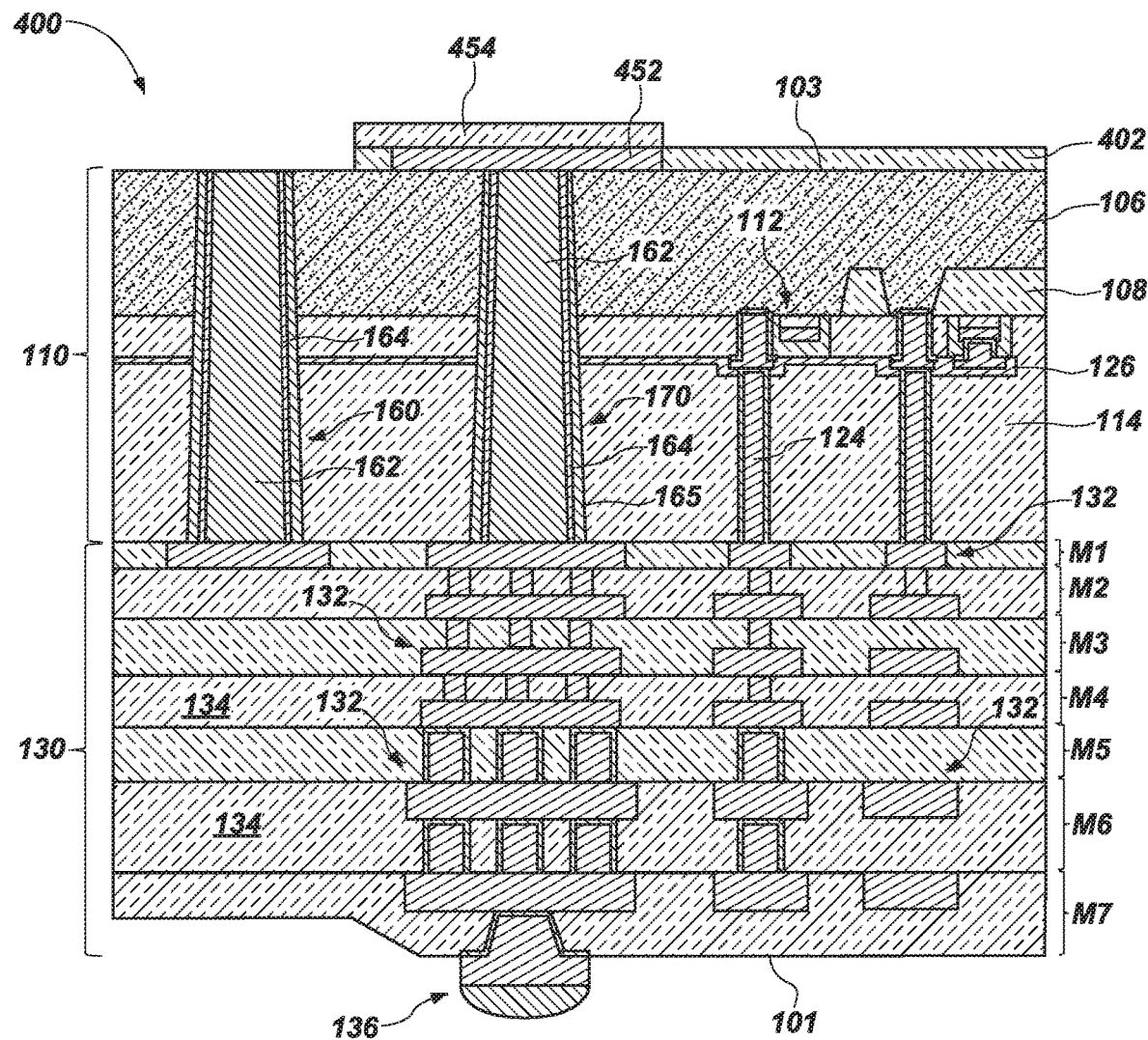

Referring to FIG. 4C, a dielectric material 454 may be formed over the first electrode 452. The dielectric material 454 may have a greater length (in the left and right directions in the view of FIG. 4C) than the first electrode 452. The dielectric material 454 may include one or more of the materials described above with reference to the dielectric material 154 (FIG. 1A, FIG. 1B).

Figure 4D:
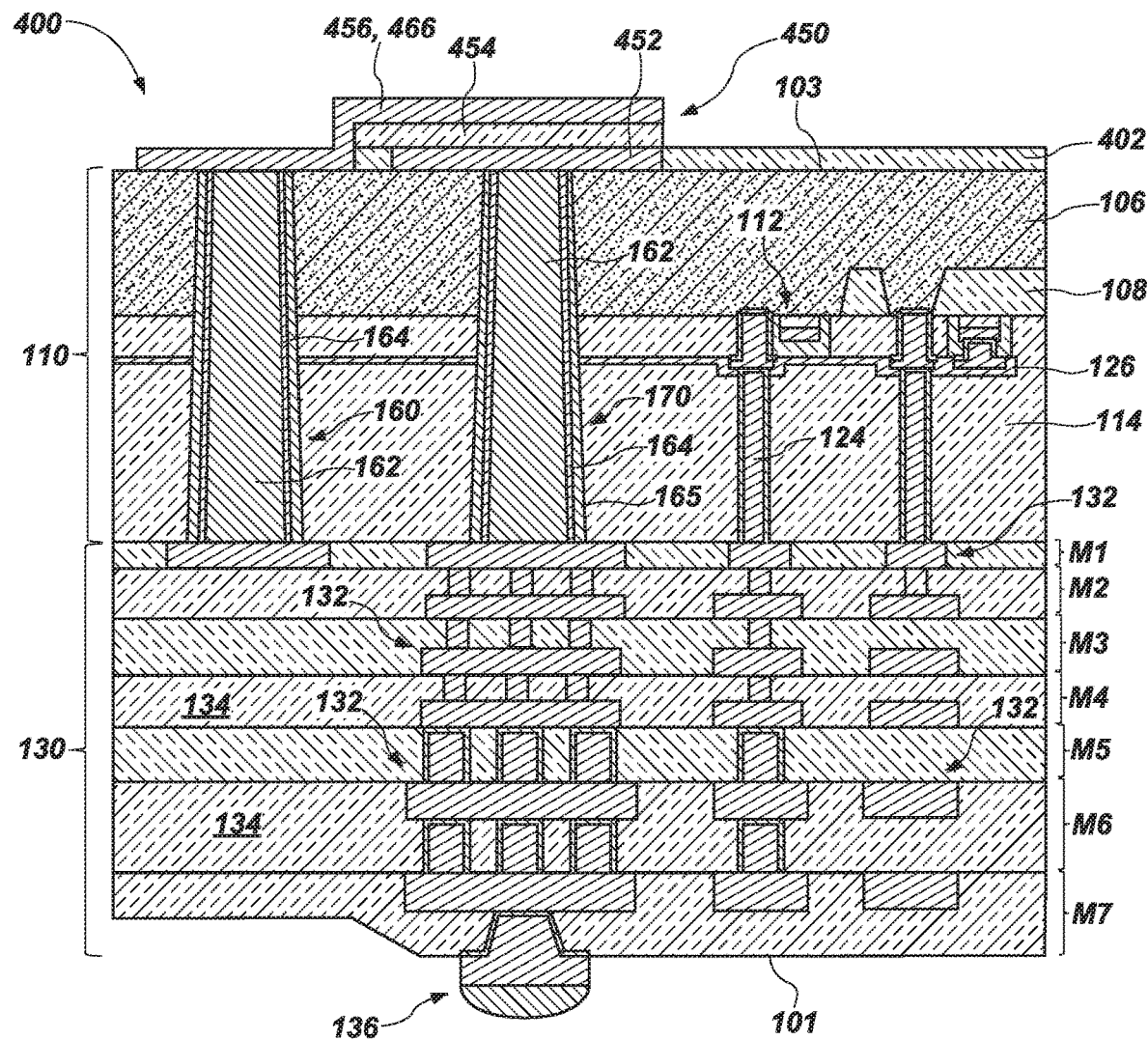

After forming the dielectric material 454, the conductive material 162 of the first conductive via 160 may be exposed, such as by removing a portion of the dielectric material 402 adjacent to the first conductive via 160. With reference to FIG. 4D, a conductive material may be formed over the dielectric material 454 and patterned to form a second electrode 456 and a redistribution line 466. The second electrode 456 may comprise one or more of the materials described above with reference to the second electrode 156 (FIG. 1A, FIG. 1B).

The first electrode 452, the dielectric material 454, and the second electrode 456 may form a decoupling capacitor 450. The decoupling capacitor 450 may be referred to as a so-called "plate capacitor." The first electrode 452 may be in electrical communication with the front side 101 through the second conductive via 170 and the conductive structures 132 of the BEOL structure 130. The second electrode 456 may be in electrical communication with the front side 101 through the first conductive via 160 and the conductive structures 132 of the BEOL structure 130.

Figure 4E:
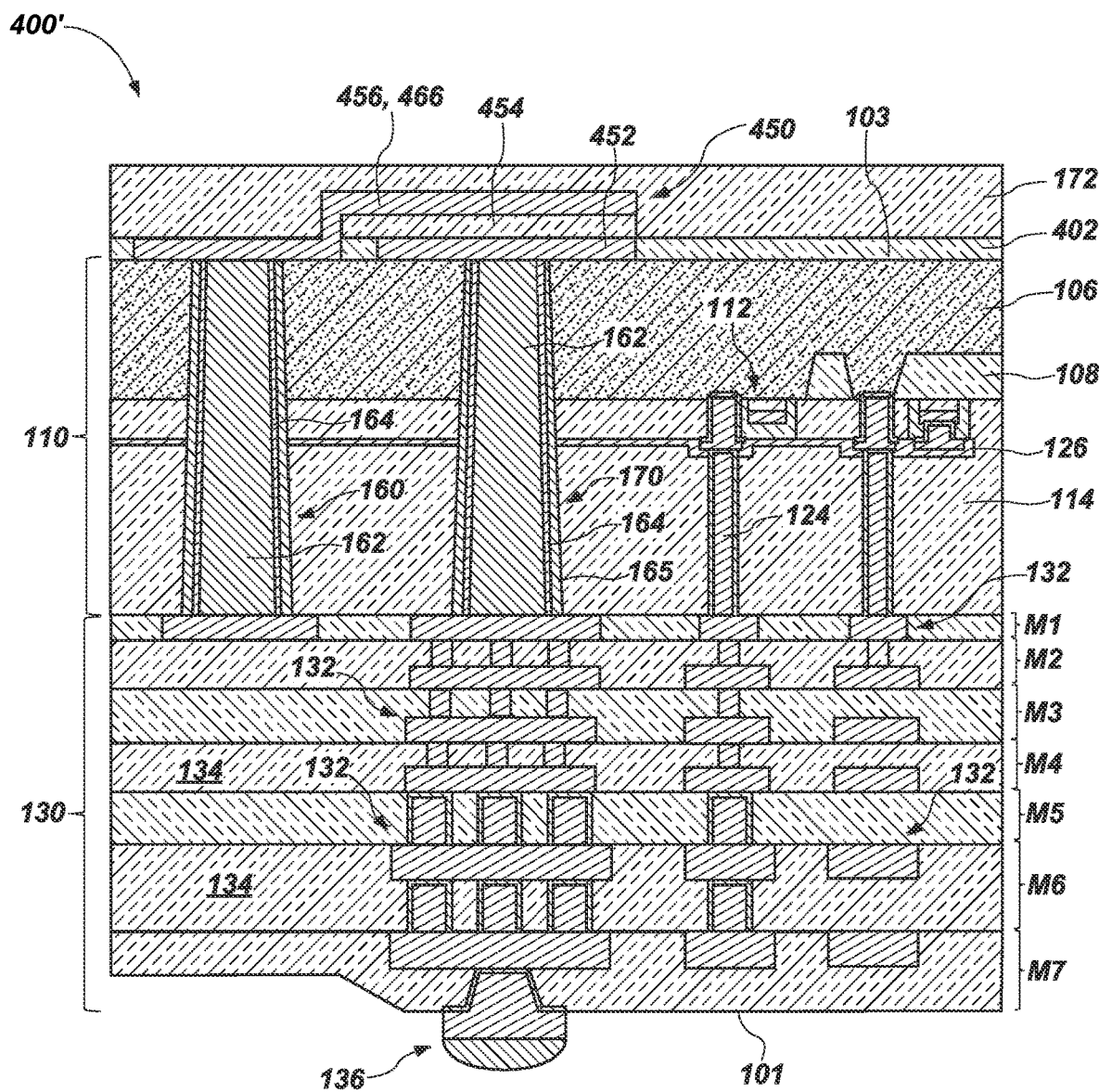

With reference to FIG. 4E, a dielectric material 172 may be formed over the second electrode 456 to electrically isolate the decoupling capacitor 450 from other components and form a microelectronic device 400'.

Figure 5:
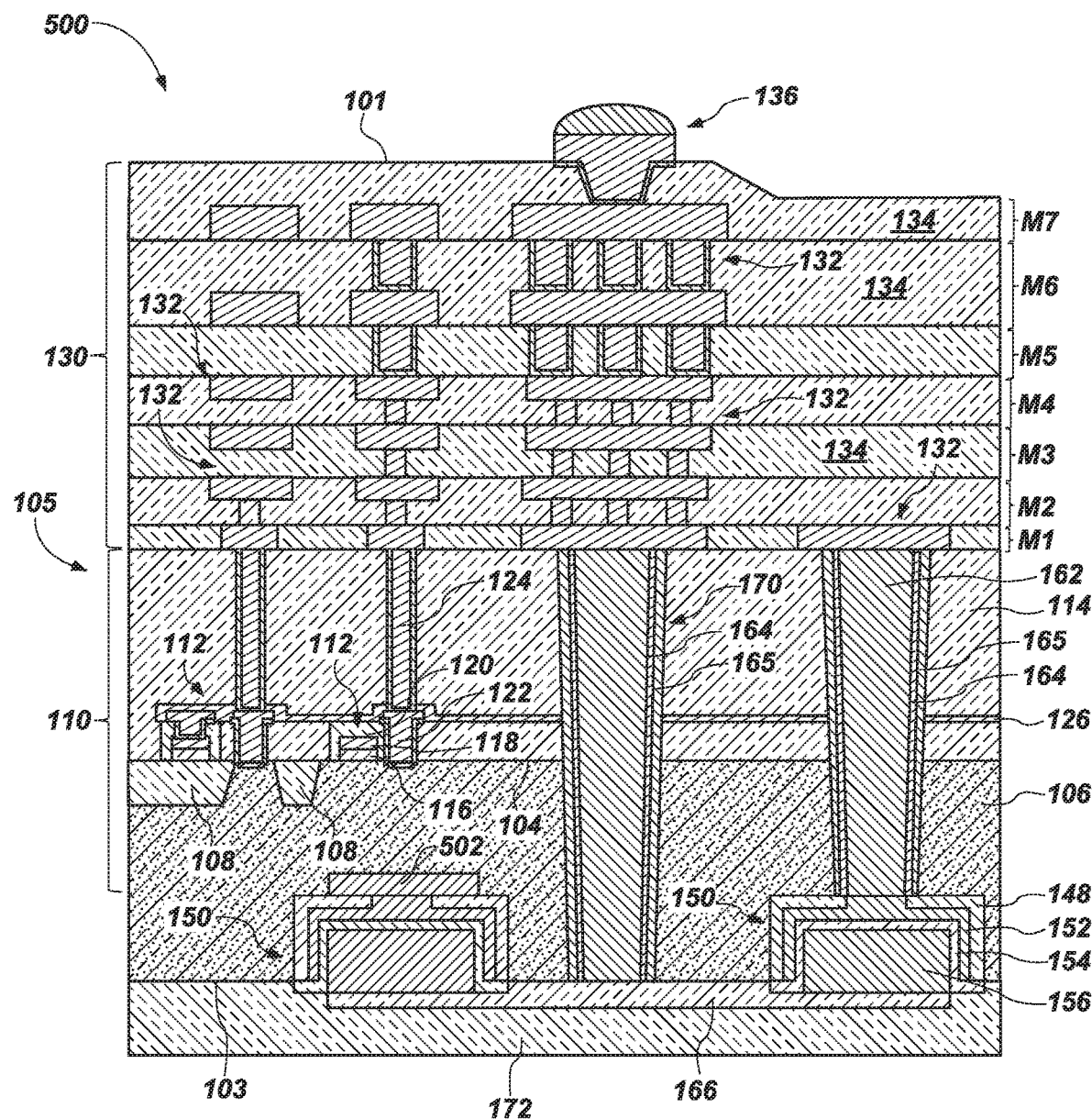
FIG. 5 is a simplified cross-sectional view of a microelectronic device including decoupling capacitors on the back side of a die, in accordance with embodiments of the disclosure.

Although the microelectronic devices 100, 300', 400' have been described and illustrated as including a single decoupling capacitor (e.g., decoupling capacitors 150, 350, 450) on the back side 103, the disclosure is not so limited. In other embodiments, a microelectronic device may include more than one decoupling capacitor (e.g., multiple decoupling capacitors) on the back side 103. FIG. 5 is a simplified cross-sectional view of a microelectronic device 500 including multiple decoupling capacitors 150 on the back side 103 of the die 105, in accordance with embodiments of the disclosure. The decoupling capacitors 150 may be substantially the same as the decoupling capacitor 150 described above with reference to FIG. 1A. While FIG. 5 illustrates multiple decoupling capacitors 150, the microelectronic devices 100, 300', 400' may include two or more decoupling capacitors 150, 350, 450. In other embodiments, at least one of the decoupling capacitors 150 may be substantially the same as the decoupling capacitor 150 of FIG. 1A or FIG. 1B and at least another of the decoupling capacitors 150 may be substantially the same as the decoupling capacitor 350 of FIG. 3D or the decoupling capacitor 450 of FIG. 4E. The capacitor structures 150, 350, 450 may be formed as described above with reference to the capacitor structure 150 of FIG. 1A, FIG. 1B, FIG. 3E, and FIG. 4E.

Although FIG. 5 illustrates only two decoupling capacitors 150, it will be understood that the back side 103 of the die 105 may include any number (e.g., three, four, ten, fifty, one hundred, one thousand), of decoupling capacitors 150.

Each of the decoupling capacitors 150 may be in electrical communication with the front side 101, as described above with reference to FIG. 1A and FIG. 1B. In some embodiments, at least one of the decoupling capacitors 150 may be in electrical communication with the front side 101 through a conductive structure 502. For example, the conductive structure 502 may be in electrical communication with a conductive via in a different cross-section than the cross-section illustrated in FIG. 5. In other embodiments, the conductive structures 502 are in electrical communication with the front side 101 through conductive vias that are located within substantially the same plane.

In some embodiments, one of the electrodes (e.g., the second electrode 156) of the decoupling capacitors 150 may be in electrical communication with the same redistribution line 166. In other words, the redistribution line 166 may be common between more than one of the decoupling capacitors 150. However, in other embodiments, at least one of the decoupling capacitors 150 (e.g., each of decoupling capacitors 150) may be electrically isolated from the other decoupling capacitors 150 and may not share, for example, a redistribution line 166 with any other of the decoupling capacitors 150.

Accordingly, in at least some embodiments, a microelectronic device comprises a die comprising a front side and a back side opposite the front side, one or more components of integrated circuitry within a base material of the die and between the front side and the back side of the die, and one or more decoupling capacitors within the back side of the die. The one or more decoupling capacitors each comprise a first electrode, a second electrode, and a dielectric material between the first electrode and the second electrode. The microelectronic device further comprises a first conductive via comprising a conductive material extending through the base material, the first conductive via in electrical communication with the first electrode of the one or more decoupling capacitors and the front side of the microelectronic device.

Accordingly, in at least some embodiments, an apparatus comprises active circuitry adjacent to a base material, a decoupling capacitor in a back side of the die, the decoupling capacitor comprising a dielectric material between a first electrode and a second electrode, a first conductive via extending through the base material and in electrical communication with a front side of the die and the first electrode of the decoupling capacitor, and a second conductive via extending through the base material and in electrical communication with the front side of the die and the second electrode of the decoupling capacitor.

Accordingly, in at least some embodiments, a method of forming a microelectronic device comprises forming a die comprising a front side and a back side opposite the front side, active circuitry located between the front side and the back side, forming a recess in a semiconductive material from the back side of the die to expose a portion of a first conductive via, forming a dielectric material within the recess, and forming a decoupling capacitor within the recess. Forming the decoupling capacitor comprises forming an opening in the dielectric material to expose a portion of the first conductive via, forming a conductive material in electrical communication with the portion of the first conductive via, forming another dielectric material adjacent to the conductive material, and forming another conductive material adjacent to the another dielectric material and in electrical communication with a second conductive via.

Figure 6:
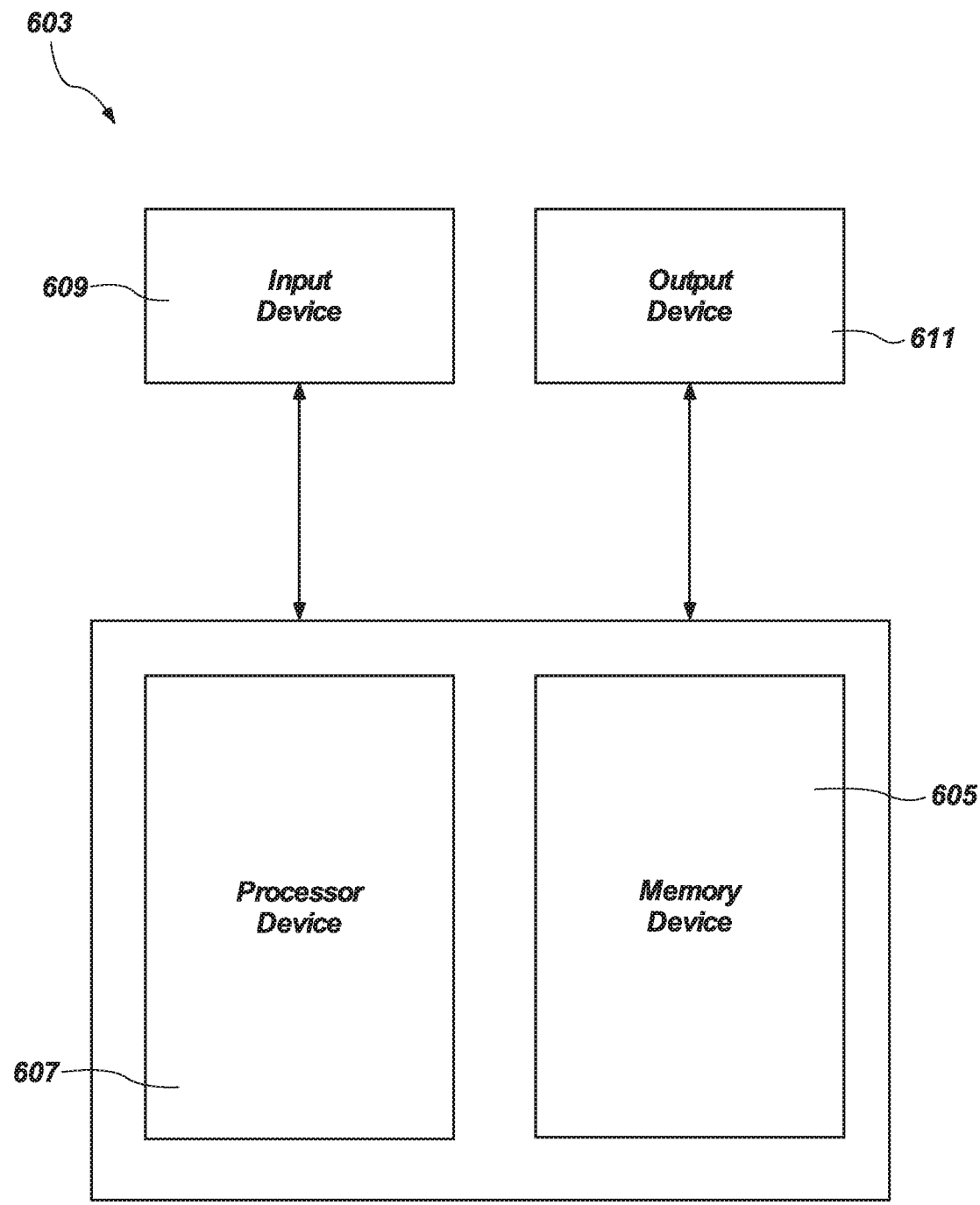
FIG. 6 is a block diagram of an electronic system, in accordance with embodiments of the disclosure.

Microelectronic devices including microelectronic devices (e.g., the microelectronic devices 100, 300', 400', 500) and microelectronic device structures (e.g., the microelectronic device structures 200, 300, 400) including the decoupling capacitors (e.g., the decoupling capacitors 150, 350, 450) in accordance with embodiments of the disclosure may be used in embodiments of electronic systems of the disclosure. For example, FIG. 6 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 603 includes at least one memory device 605. The memory device 605 may include, for example, an embodiment of a microelectronic device structure previously described herein (e.g., one of the microelectronic devices 100, 300', 400', 500 or the microelectronic device structures 200, 300, 400 previously described with reference to FIG. 1, FIG. 2A through FIG. 5) including the decoupling capacitors (e.g., the decoupling capacitors 150, 350, 450).

The electronic system 603 may further include at least one electronic signal processor device 607 (often referred to as a "microprocessor"). The electronic signal processor device 607 may, optionally, include an embodiment of a microelectronic device or a microelectronic device structure previously described herein (e.g., one or more of the microelectronic devices 100, 300', 400', 500 or the microelectronic device structures 200, 300, 400 previously described with reference to FIG. 1A, FIG. 1B, FIG. 2A through FIG. 5). The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607.

Figure 7:
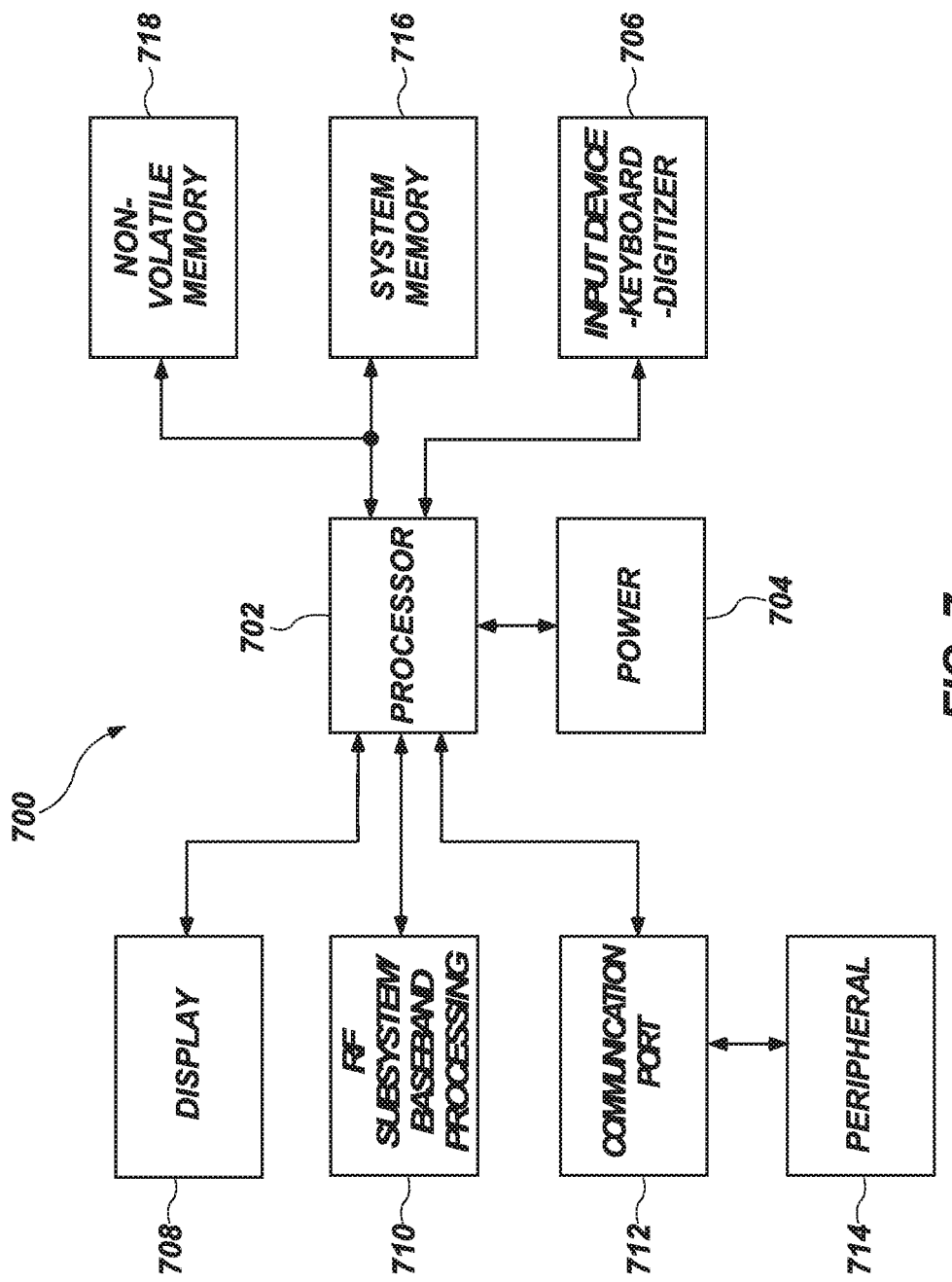
FIG. 7 is a processor-based system, in accordance with embodiments of the disclosure.

With reference to FIG. 7, depicted is a processor-based system 700. The processor-based system 700 may include various microelectronic devices and microelectronic device structures (e.g., microelectronic devices and microelectronic device structures including one or more of the microelectronic devices 100, 300', 400', 500 or the microelectronic device structures 200, 300, 400) manufactured in accordance with embodiments of the present disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 and other subcomponents of the processor-based system 700 may include microelectronic devices and microelectronic device structures (e.g., microelectronic devices and microelectronic device structures including one or more of the microelectronic devices 100, 300', 400', 500 or the microelectronic device structures 200, 300, 400) manufactured in accordance with embodiments of the present disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other devices may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include semiconductor devices, such as the microelectronic devices and microelectronic device structures (e.g., the microelectronic devices 100, 300', 400', 500 and the microelectronic device structures 200, 300, 400) described above, or a combination thereof.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and flash memory to be used in conjunction with the system memory 716. The size of the non-volatile memory 718 is typically selected to be just large enough to store any necessary operating system, application programs, and fixed data. Additionally, the non-volatile memory 718 may include a high-capacity memory such as disk drive memory, such as a hybrid-drive including resistive memory or other types of non-volatile solid-state memory, for example. The non-volatile memory 718 may include microelectronic devices, such as the microelectronic devices and microelectronic device structures (e.g., the microelectronic devices 100, 500 and the microelectronic device structures 200, 300, 400) described above, or a combination thereof.

Accordingly, in at least some embodiments, an electronic system comprises a processor device operably coupled to an input device and an output device, and a memory device operably coupled to the processor device and comprising at least one microelectronic device. The at least one microelectronic device comprises an active region comprising a semiconductive material between a front side and a back side of a die, a decoupling capacitor in the back side of the die, the decoupling capacitor comprising a first electrode, a second electrode, and a dielectric material between the first electrode and the second electrode, a first conductive via extending through the semiconductive material and in electrical communication with the first electrode of the decoupling capacitor and with the front side of the die, a redistribution line in electrical communication with the second electrode of the decoupling capacitor, and a second conductive via in electrical communication with the redistribution line and the front side of the die.

Figure 8:
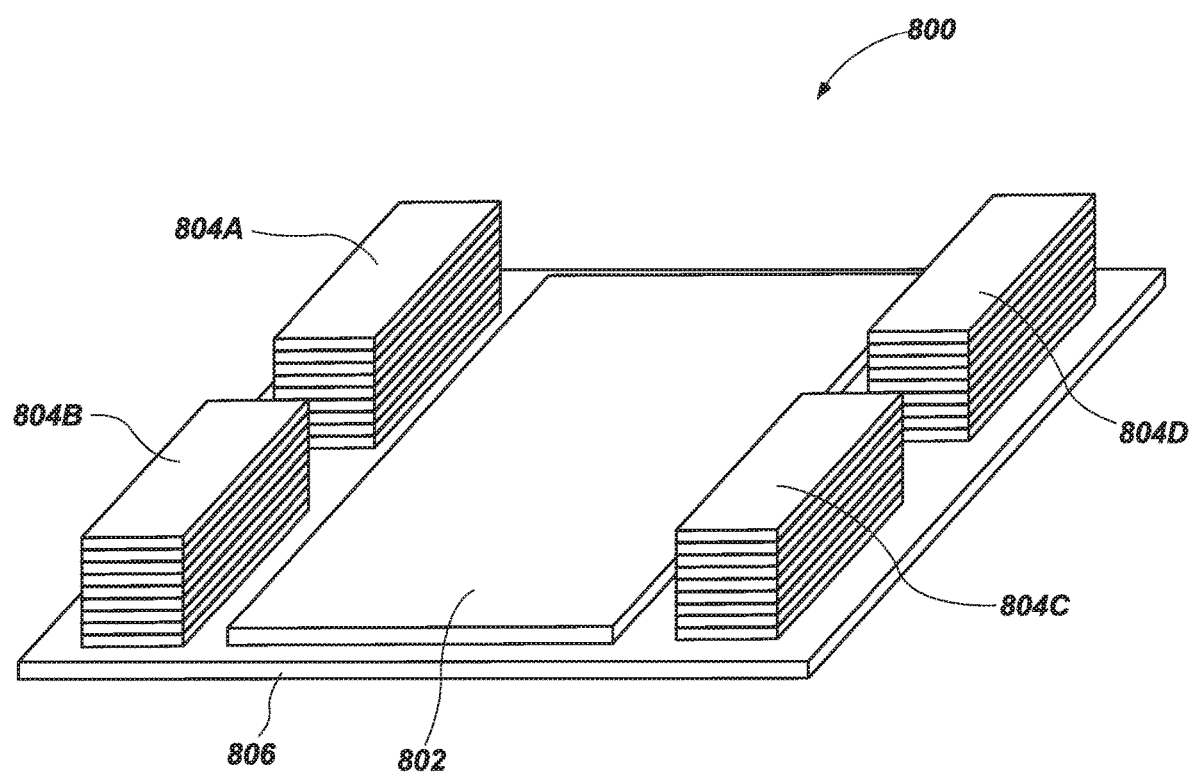
FIG. 8 is a simplified schematic perspective view of a microelectronic assembly including a host device in the form of a processor, and multiple microelectronic devices mounted to an interposer, in accordance with embodiments of the disclosure.

FIG. 8 is a simplified schematic perspective view of a microelectronic assembly 800 including a host device in the form of a processor 802, and multiple microelectronic devices 804a-804d, collectively referred to herein as reference 804, mounted to an interposer 806 comprising a semiconductor material (e.g., silicon), in accordance with embodiments of the disclosure.

The processor 802 may be any of multiple configurations of a processor (e.g., a central processing unit (CPU), a graphics processing unit (GPU), a controller), or a system on a chip (Sod'), or some other form of host device. The microelectronic devices 804 of the multiple microelectronic devices 804 may comprise one or more of the microelectronic devices 100, 500 or the microelectronic device structures 200, 300, 400 described above with reference to FIG. 1A through FIG. 5. The microelectronic devices 804 may be of the same or different forms; and any of the memory devices may be either a single die or a stack of interconnected memory die.

The processor 802 may exchange information with one or more of the microelectronic devices 804 using signals communicated over signal paths formed at least in part within the interposer 806. In some embodiments, the interposer 806 is coupled to an external structure, such as a package substrate, a motherboard, etc., to form part of a larger system (such as the processor-based system 700 (FIG. 7)).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a die comprising a front side and a back side opposite the front side;
one or more components of integrated circuitry within a base material of the die and between the front side and the back side of the die;
one or more decoupling capacitors within the back side of the die, the one or more decoupling capacitors each comprising:
a first electrode;
a second electrode; and
a dielectric material between the first electrode and the second electrode;
a first conductive via comprising a conductive material extending through the base material, the first conductive via in electrical communication with the first electrode of the one or more decoupling capacitors and the front side of the microelectronic device; and
a second conductive via in electrical communication with the second electrode of the one or more decoupling capacitors and the front side of the microelectronic device.

2. The microelectronic device of claim 1, wherein the second conductive via is in electrical communication with the second electrode through a redistribution line.

3. The microelectronic device of claim 1, wherein the second conductive via is laterally offset from the second electrode.

4. The microelectronic device of claim 1, wherein the dielectric material comprises silicon dioxide.

5. The microelectronic device of claim 1, wherein the first conductive via directly contacts the first electrode.

6. The microelectronic device of claim 1, wherein the first conductive via extends through a memory array region of the microelectronic device.

7. The microelectronic device of claim 1, wherein the first electrode and the second electrode comprise interdigitated electrodes.

8. The microelectronic device of claim 1, wherein the first electrode comprises sidewalls extending in a substantially perpendicular direction with respect to a major surface of the base material.

9. An apparatus, comprising:
active circuitry adjacent to a base material;

a decoupling capacitor in a back side of a die, the decoupling capacitor comprising a dielectric material between a first electrode and a second electrode;
a first conductive via extending through the base material and in electrical communication with a front side of the die and the first electrode of the decoupling capacitor; and
a second conductive via extending through the base material and in electrical communication with the front side of the die and the second electrode of the decoupling capacitor.

10. The apparatus of claim 9, wherein the first conductive via is directly adjacent to and in contact with the first electrode.

11. The apparatus of claim 9, further comprising a redistribution line extending between the second conductive via and the second electrode.

12. The apparatus of claim 11, further comprising another decoupling capacitor in the back side of the die, the another decoupling capacitor comprising another electrode in electrical communication with the redistribution line.

13. The apparatus of claim 9, wherein the first conductive via and the second conductive via comprise copper.

14. The apparatus of claim 9, wherein the first electrode comprises portions spaced from each other by the dielectric material and portions of the second electrode.

15. The apparatus of claim 9, wherein the first conductive via is in electrical communication with the front side of the die through conductive structures in metallization layers of the die.

16. The apparatus of claim 9, wherein the first electrode and the second electrode are substantially planar.

17. The apparatus of claim 9, wherein the first conductive via is electrically connected to a voltage source.

18. A method of forming a microelectronic device, the method comprising:
forming a die comprising a front side and a back side opposite the front side, active circuitry located between the front side and the back side;
forming a recess in a semiconductive material from the back side of the die to expose a portion of a first conductive via;
forming a dielectric material within the recess; and
forming a decoupling capacitor within the recess, forming the decoupling capacitor comprising:
forming an opening in the dielectric material to expose a portion of the first conductive via;
forming a conductive material in electrical communication with the portion of the first conductive via;
forming another dielectric material adjacent to the conductive material; and
forming another conductive material adjacent to the another dielectric material and in electrical communication with a second conductive via.

19. The method of claim 18, wherein forming another conductive material adjacent to the another dielectric material and in electrical communication with a second conductive via comprises forming a redistribution line in electrical communication with the second conductive via and a second electrode.

20. The method of claim 18, wherein forming another conductive material comprises forming the another conductive material to be laterally offset from the second conductive via.

21. The method of claim 18, wherein forming a conductive material in electrical communication with the portion of the first conductive via comprises forming the conductive material to include portions separated from each other by gaps.

22. The method of claim 18, further comprising forming at least one of the first conductive via and the second conductive via to extend through the active circuitry.

23. An electronic system, comprising:
a processor device operably coupled to an input device and an output device; and
a memory device operably coupled to the processor device and comprising at least one microelectronic device comprising:
an active region comprising a semiconductive material between a front side and a back side of a die;
a decoupling capacitor in the back side of the die, the decoupling capacitor comprising a first electrode, a second electrode, and a dielectric material between the first electrode and the second electrode;
a first conductive via extending through the semiconductive material and in electrical communication with the first electrode of the decoupling capacitor and with the front side of the die;
a redistribution line in electrical communication with the second electrode of the decoupling capacitor; and
a second conductive via in electrical communication with the redistribution line and the front side of the die.

* * * * *

UNITED STATES PATENT AND TRADEMARK OFFICE
CERTIFICATE OF CORRECTION

PATENT NO. : 11,264,388 B2
APPLICATION NO. : 16/876362
DATED : March 1, 2022
INVENTOR(S) : Chao Wen Wang Page 1 of 1

It is certified that error appears in the above-identified patent and that said Letters Patent is hereby corrected as shown below:

In the Specification
Column 19, Line 59, change "chip (Sod')," to --chip (SoC),--

Signed and Sealed this
Tenth Day of May, 2022

Katherine Kelly Vidal
*Director of the United States Patent and Trademark Office*